United States Patent
Lu

(10) Patent No.: US 8,869,085 B2
(45) Date of Patent: Oct. 21, 2014

(54) MULTI-FINGER TRANSISTOR LAYOUT FOR REDUCING CROSS-FINGER ELECTRIC VARIATIONS AND FOR FULLY UTILIZING AVAILABLE BREAKDOWN VOLTAGES

(71) Applicant: International Business Machines Corporation, Armonk, NY (US)

(72) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 121 days.

(21) Appl. No.: 13/649,769

(22) Filed: Oct. 11, 2012

(65) Prior Publication Data

US 2014/0103434 A1   Apr. 17, 2014

(51) Int. Cl.
*G06F 17/50* (2006.01)

(52) U.S. Cl.
USPC ........... 716/115; 716/110; 716/118; 716/119; 716/122

(58) Field of Classification Search
USPC ....................................................... 716/115
See application file for complete search history.

(56) References Cited

U.S. PATENT DOCUMENTS

| | | | |
|---|---|---|---|
| 6,750,517 B1 | 6/2004 | Ker et al. | |
| 6,802,050 B2 | 10/2004 | Shen et al. | |
| 7,646,063 B1 | 1/2010 | Boyd et al. | |
| 7,791,160 B2 | 9/2010 | Kim et al. | |
| 2002/0188920 A1 | 12/2002 | Lampaert et al. | |
| 2006/0284261 A1 | 12/2006 | Sriram | |
| 2008/0109770 A1* | 5/2008 | Kim et al. | 716/4 |

OTHER PUBLICATIONS

Jiang, et al., "Model Analysis of Multi-Finger MOSFET Layout in Ring Oscillator Design," 12th International Symposium on Quality Electronic Design, 2011, pp. 347-352.

* cited by examiner

*Primary Examiner* — Vuthe Siek
*Assistant Examiner* — Eric Lee
(74) *Attorney, Agent, or Firm* — Gibb & Riley, LLC; David A. Cain, Esq.

(57) ABSTRACT

Structure and methods for a semiconductor transistor design. The transistor structure comprises a field effect transistor having a multi-finger gate and three or more diffusion regions. Each diffusion region is identified as either a source region or a drain region, and each diffusion region is further identified as either an inner diffusion region or an outer diffusion region. Electrical contacts are established in the inner diffusion regions and the outer diffusion regions. There are approximately twice as many contacts in an inner source region as in the outer source region. There are approximately twice as many contacts in an inner drain region as in the outer drain region. The number and locations of contacts in each diffusion region are adjusted to reduce the difference among source node voltages of all fingers and the difference among drain node voltages of all fingers.

20 Claims, 20 Drawing Sheets

US 8,869,085 B2

MULTI-FINGER TRANSISTOR LAYOUT FOR REDUCING CROSS-FINGER ELECTRIC VARIATIONS AND FOR FULLY UTILIZING AVAILABLE BREAKDOWN VOLTAGES

BACKGROUND

The present disclosure relates generally to integrated circuit device design, and more specifically, to a layout for a field effect transistor (FET) device with a multi-finger gate structure and multiple source/drain regions.

Multi-fingered field effect transistors (FETs) are widely used in various integrated circuit applications. Multi-finger transistor layouts are widely used in CMOS circuit designs. Compared with single-finger transistor layout, its main features include effectiveness in reducing circuit physical size, reducing gate resistance (and thus improve the RF performance of the FET), and improving device matching. There is a need to make each finger's source node voltage the same for all fingers and also to make each finger's drain node voltage the same for all fingers. Namely, there exists a need to reduce cross-finger electric variations of the multi-finger FET device.

In conventional multi-finger transistor layouts, electric currents passing through individual finger transistors are not the same. More specifically, there are more drain current and more gate leakage current in an outer finger than those in an inner finger. In other words, when going from an outer finger to an inner finger, there is a systematic variation in each finger's electric current. Additionally, for a given drain breakdown voltage of a given FET type, prior-art multi-finger layout cannot fully utilize available drain breakdown voltage.

SUMMARY

According to one embodiment herein, a method for creating a semiconductor transistor design is disclosed. The semiconductor transistor design comprises a field effect transistor having a multi-finger gate structure on a diffusion shape. The multi-finger gate structure comprises gate fingers, and the diffusion shape comprises a diffusion edge positioned along a periphery of the diffusion shape. According to the method, inner diffusion regions of the multi-finger gate structure are identified as being between the gate fingers. Outer diffusion regions of the multi-finger gate structure are identified as being one of: between one of the gate fingers and the diffusion edge, and between one of the gate fingers and a dummy finger. The dummy finger is parallel to and electrically disconnected from the gate fingers. Each of the inner diffusion regions is identified as being one of inner source regions and inner drain regions. Each of the outer diffusion regions is identified as being one of outer source regions and outer drain regions. Electrical contacts are established in the inner diffusion region and the outer diffusion region. Since the drain current through an inner diffusion region and its contacts is approximately twice the drain current through an outer diffusion region and its contacts, the establishing of the electrical contacts complies with a first ratio of there being approximately twice as many of the electrical contacts in the inner source regions as in the outer source regions, and the establishing of the electrical contacts complies with a second ratio of there being approximately twice as many of the electrical contacts in the inner drain regions as in the outer drain regions. The first ratio is tuned to cause a voltage drop across the electrical contacts in the inner source regions and the electrical contacts in the outer source regions to be approximately equal for all the gate fingers. The second ratio is tuned to cause a voltage drop across the electrical contacts in the inner drain regions and the electrical contacts in the outer drain regions to be approximately equal for all the gate fingers.

According to another embodiment herein, a semiconductor transistor structure is disclosed. The semiconductor transistor structure comprises a field effect transistor having a multi-finger gate structure comprising gate fingers and a diffusion shape comprising a diffusion edge positioned along a periphery of the diffusion shape. The diffusion shape comprises inner diffusion regions of the multi-finger gate structure. The inner diffusion regions are between the gate fingers. The inner diffusion regions are one of inner source regions and inner drain regions. The diffusion shape further comprises outer diffusion regions of the multi-finger gate structure. The outer diffusion regions are one of: between one of the gate fingers and the diffusion edge and between one of the gate fingers and a dummy finger. A dummy finger is parallel to and electrically disconnected from the gate fingers. The outer diffusion regions are one of outer source regions and outer drain regions. A plurality of electrical contacts is in the inner diffusion regions and the outer diffusion regions. There is a first ratio of approximately twice as many of the electrical contacts in the inner source regions as in the outer source regions and a second ratio of approximately twice as many of the electrical contacts in the inner drain regions as in the outer drain regions. The first ratio is tuned such that a voltage drop across the electrical contacts in the inner source regions and the electrical contacts in the outer source regions is approximately equal for all the gate fingers. The second ratio is tuned such that a voltage drop across the electrical contacts in the inner drain regions and the electrical contacts in the outer drain regions is approximately equal for all the gate fingers.

According to another embodiment herein, a non-transitory computer readable storage medium readable by a computerized device disclosed. The non-transitory computer readable storage medium stores instructions executable by the computerized device to perform a method for creating a semiconductor transistor design comprising a field effect transistor having a multi-finger gate structure on a diffusion shape. The multi-finger gate structure comprises gate fingers, and the diffusion shape comprises a diffusion edge positioned along a periphery of the diffusion shape. According to the method, inner diffusion regions of the multi-finger gate structure are identified as being between the gate fingers. Outer diffusion regions of the multi-finger gate structure are identified as being one of: between one of the gate fingers and the diffusion edge, and between one of the gate fingers and a dummy finger. The dummy finger is parallel to and electrically disconnected from the gate fingers. Each of the inner diffusion regions is identified as being one of inner source regions and inner drain regions. Each of the outer diffusion regions is identified as being one of outer source regions and outer drain regions. Electrical contacts are established in the inner diffusion region and the outer diffusion region. Since the drain current through an inner diffusion region and its contacts is approximately twice the drain current through an outer diffusion region and its contacts, the establishing of the electrical contacts complies with a first ratio of there being approximately twice as many of the electrical contacts in the inner source regions as in the outer source regions, and the establishing of the electrical contacts complies with a second ratio of there being approximately twice as many of the electrical contacts in the inner drain regions as in the outer drain regions. The first ratio is tuned to cause a voltage drop across the electrical contacts in the inner source regions and the electrical contacts in the outer source regions to be approximately equal for all the gate fingers. The second ratio is tuned to cause a voltage drop across the electrical contacts in the inner drain regions and the electrical contacts in the outer drain regions to be approximately equal for all the gate fingers.

BRIEF DESCRIPTION OF THE DRAWINGS

The embodiments herein will be better understood from the following detailed description with reference to the drawings, which are not necessarily drawn to scale, and in which.

DETAILED DESCRIPTION

Figure 1:
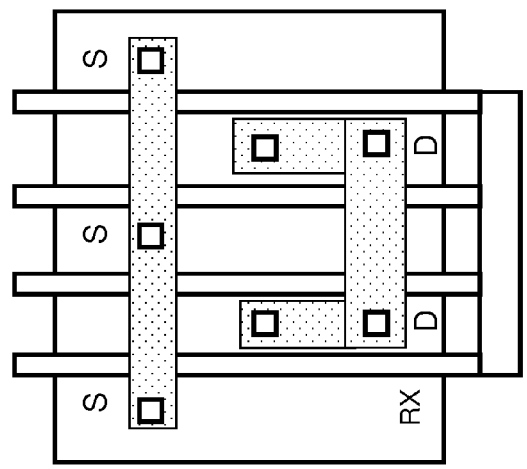
FIG. 1 is a layout of a multi-finger FET.
Figure 1:
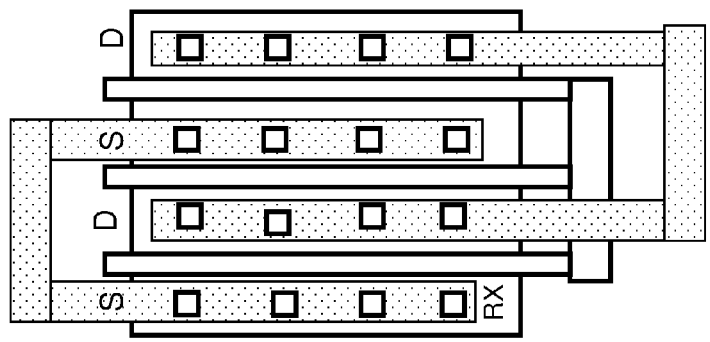

The embodiments herein and the various features and advantageous details thereof are explained more fully with reference to the non-limiting embodiments that are illustrated in the accompanying drawings and detailed in the following description.

Referring now to the drawings, there are shown exemplary illustrations of the method and structures of a multi-finger FET (field effect transistor) and processes for designing and layout according to embodiments herein. The claims herein can define a semiconductor structure, a method for manufacturing such a structure, a process for designing the structure, etc. The processes herein can include, for example, positioning elements such as gates, diffusion regions, conductive regions, contacts, etc., within an overall integrated circuit design and such can include making physical changes to elements and/or making changes to designs (which may be maintained in written form, in computerized (digital) form, etc.). Therefore, while some structures are described below, this disclosure of such structures also includes the methods for making such structures and the methods for designing such structures.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

FIG. 1 illustrates a layout of a multi-finger FET, where the contact number in a source region is the same for all source regions and the contact number in a drain region is the same for all drain regions. Typically, contact resistance is much larger than diffusion resistance and wire resistance. The drain current through an inner diffusion region and its contacts is approximately twice the drain current through an outer diffusion region and its contacts. Thus, the voltage drop across all contacts in an inner diffusion region is about twice of the voltage drop across all contacts in an outer diffusion region. There is a larger drain voltage ($V_d$-$V_s$) for any finger with an outer diffusion and a larger gate voltage ($V_g$-$V_s$) for any finger with an outer source. This leads to a larger drain current for any outer finger with an outer source (from linear to saturation regions) and a larger drain current for any outer finger with an outer drain (linear region). This also results in larger gate leakage current for any outer finger with an outer source.

Figure 2:
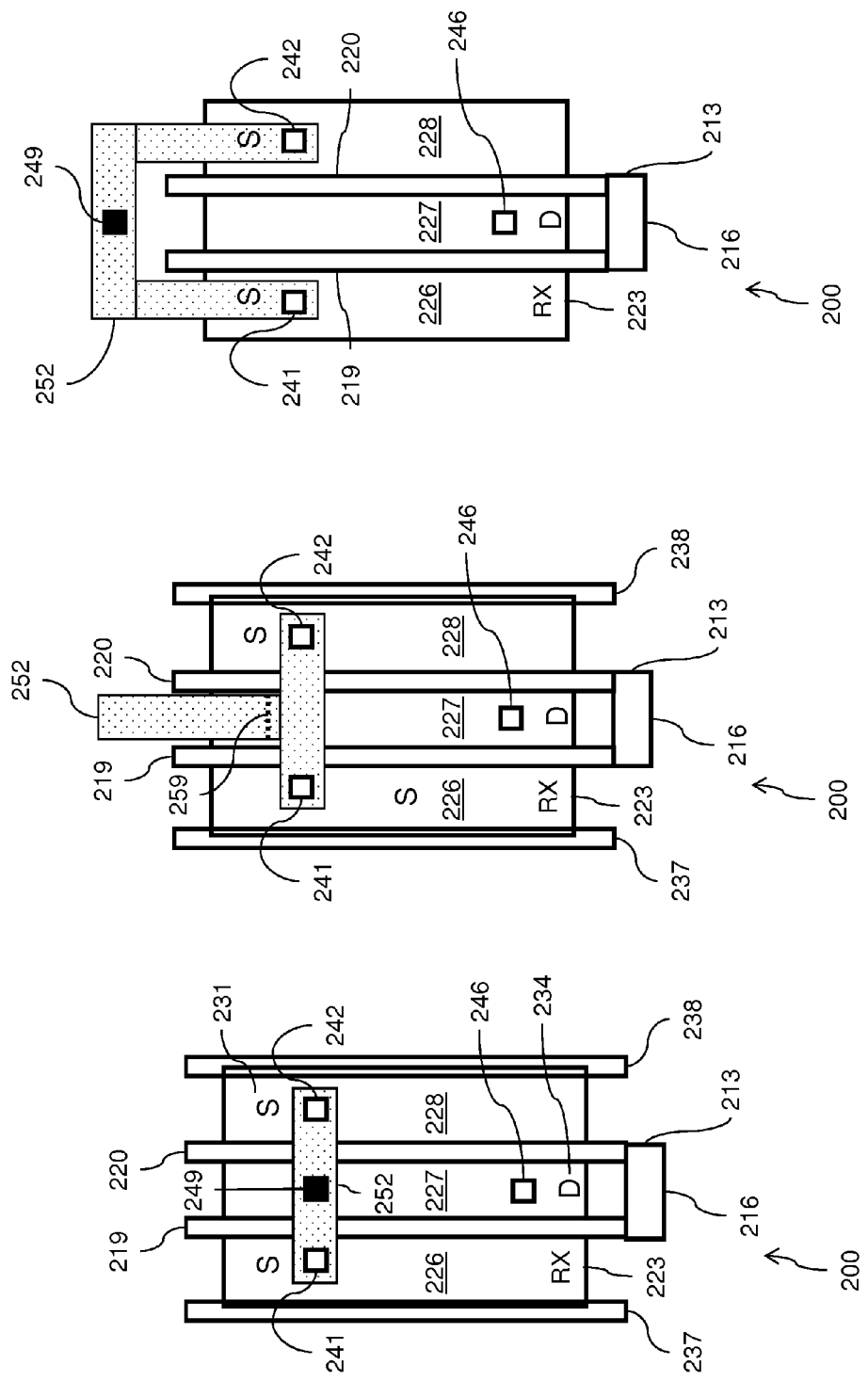
FIG. 2 is a schematic diagram of a semiconductor structure illustrating embodiments herein.

Other structures and methods herein include a multi-fingered FET with multiple contacts in a source/drain region. As shown in FIG. 2, a FET device 200 can comprise a single gate structure 213 comprising a main body 216 and multiple, essentially parallel, gate fingers 219, 220 (also referred to as segments or extensions) extending laterally from one side of the main body 216 across a semiconductor body 223. The semiconductor body 223 defines a diffusion shape, indicated as RX. Each gate finger 219, 220 can be positioned adjacent to (i.e., on, above, etc.) a corresponding diffusion region 226, 227, 228. The diffusion regions 226, 227, 228 are either the source region 231 or the drain region 234 of the multi-finger FET device 200.

For example, as illustrated in FIG. 2, gate finger 219 is positioned between diffusion region 226, a source region, and diffusion region 227, a drain region; and gate finger 220 is positioned between diffusion region 227, a drain region, and diffusion region 228, a source region.

The device may also include one or more dummy fingers 237, 238. A dummy finger is either a finger outside a diffusion shape RX or a finger whose width is not completely within a diffusion shape. Advanced semiconductor technologies typically require dummy PC shapes to better print out PC shapes on wafers.

Additionally, the diffusion regions 226, 227, 228 are identified as inner diffusion regions or outer diffusion regions. A diffusion region between two active fingers, such as between gate fingers 219 and 220, is an inner diffusion region. In FIG. 2, diffusion region 227 is an inner diffusion region. A diffusion region between an active finger and an edge of the diffusion shape RX is an outer diffusion region, and a diffusion region between an active finger and a dummy finger, such as between gate finger 220 and dummy finger 238, is also an outer diffusion region. In FIG. 2, diffusion regions 226 and 228 are outer diffusion regions.

FIG. 2 shows three examples in which the number of fingers is two; therefore, according to embodiments herein, when the number of fingers is two, the transistor layout is completely symmetric. That is, the same number of diffusion region contacts 241, 242 is used in each of the two outer diffusion regions 226, 228. Furthermore, the layout of source and drain regions within the semiconductor body 223 can be such that a shared source region or a shared drain region is located between adjacent gate fingers. A via 249, located half way between contacts 241 and 242, serves as a common electrical connection point on the source side for all drain currents, i.e., a point in a drain current path where the drain currents from all fingers first meet. A point of a metal wire that collects all drain currents can also be a common connection point for all drain currents. In the middle layout in FIG. 2, an electrical connector 252, such as a metal wire, connects both outer diffusion regions 226, 228. A simple cut in the metal wire, such as 259 of the electrical connector 252, is a common connection point for all drain currents. According to embodiments herein, the electrical connector 252 is symmetric with respect to both outer diffusion regions 226, 228.

Figure 3:
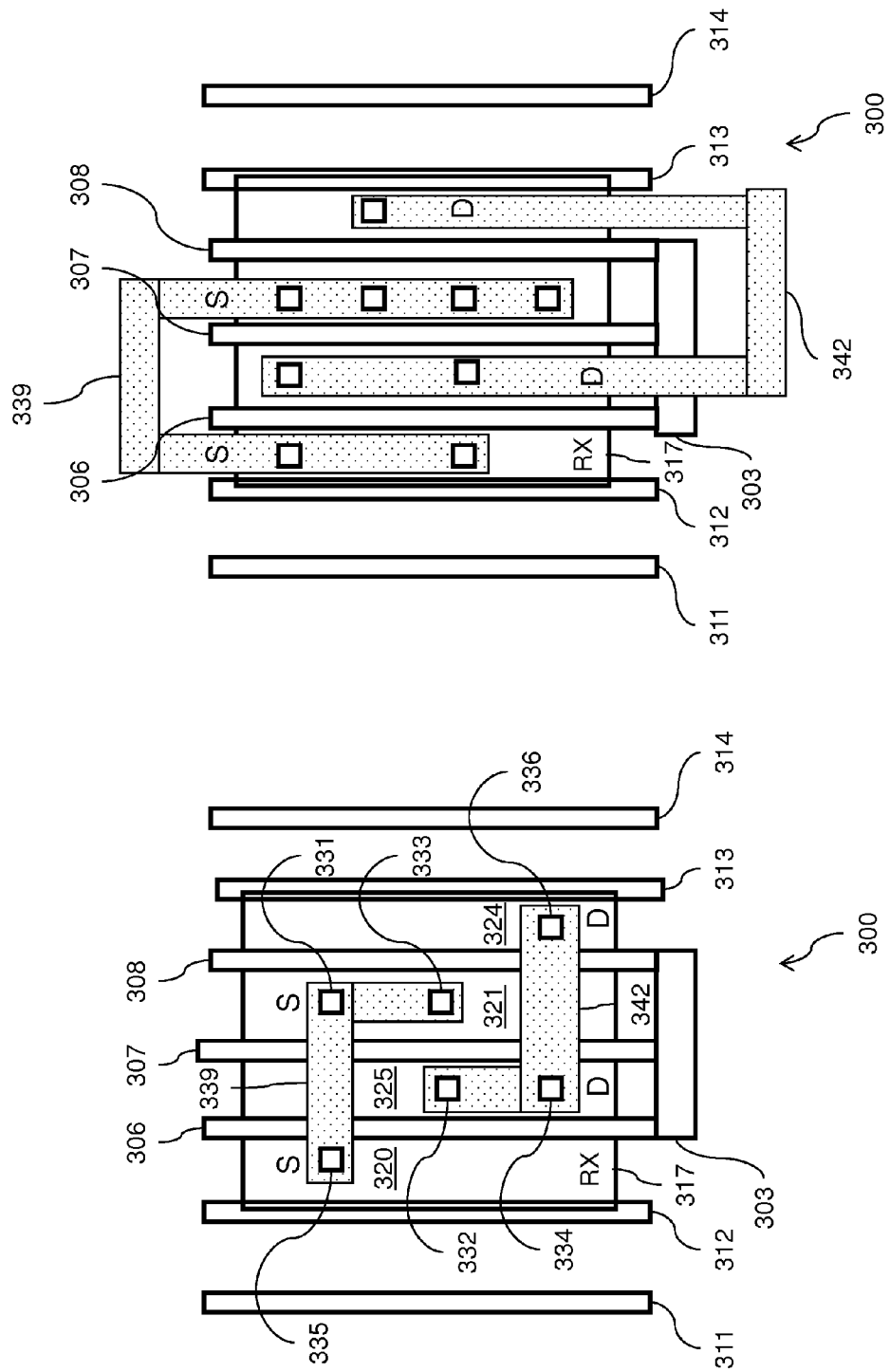
FIG. 3 is a schematic diagram of a semiconductor structure illustrating embodiments herein.

Referring to FIG. 3, a FET 300 having a three-finger gate 303 is shown. FET 300 includes a gate 303 with multiple essentially parallel fingers 306-308, several dummy fingers 311-314, and a semiconductor body 317 that defines a diffusion shape, indicated as RX, which is divided into inner diffusion regions and outer diffusion regions. The FET 300 includes an outer source region 320 and an inner source region 321, and an outer drain region 324 and an inner drain region 325.

According to embodiments herein, there are several diffusion region contacts 331-336 in the contact layer. As shown, there can be more contacts 331, 333 in an inner source region 321 than contacts 335 in an outer source region 320, and there are more contacts 332, 334 in an inner drain region 325 than contacts 336 in an outer drain region 324. As shown in the illustration on the right, the number of contacts in each inner source region is twice that in each outer source region, and the number of contacts in each inner drain region is twice that in each outer drain region. An electrical connector 339, such as a first metal wire in the lowest metal layer M1, connects the outer source region 320 and the inner source region 321. A second electrical connector 342, such as a second metal wire in the lowest metal layer M1, connects the outer drain region 324 and the inner drain region 325.

Figure 4:
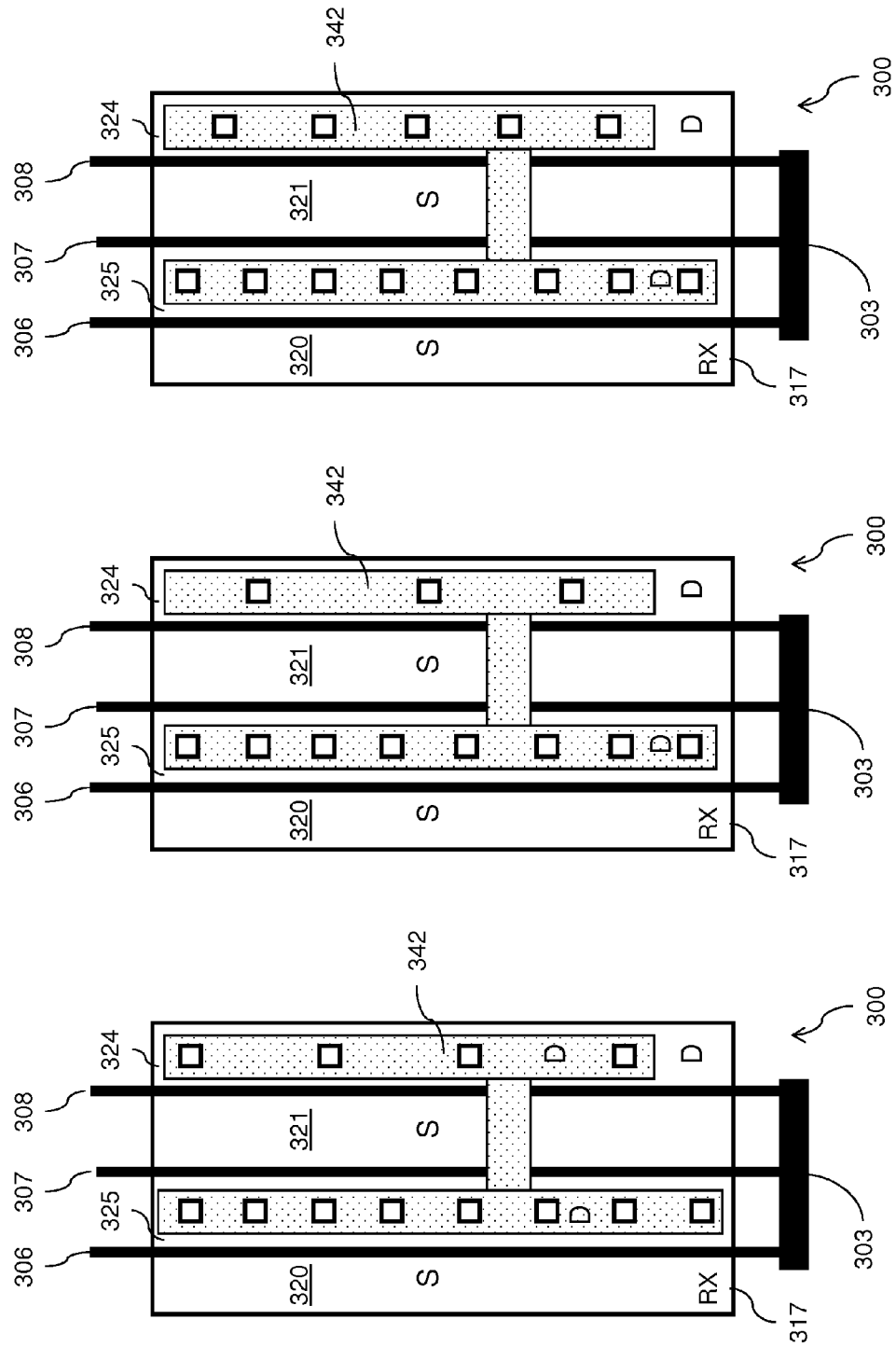
FIG. 4 is a schematic diagram of a semiconductor structure illustrating embodiments herein.

The illustrations in FIG. 4 focus on the drain regions 324, 325, which are connected by the second electrical connector 342. (In FIG. 4, the dummy fingers are not shown to improve clarity.) According to the illustrated embodiments, the number of contacts $N_{d,\ outer}$ in the outer drain region 324 may be adjusted. FIG. 4 shows several layouts having the same number of electrical contacts $N_{d,\ inner}$ in the inner drain region 325, but different numbers of contacts in the outer drain region 324. As shown herein, calculate the difference between the resistance for the outer drain region 324 and the inner drain region 325 using an equation such as $|R_{d,\ outer} - 2R_{d,\ inner}|$ for each layout. Notice that $R_{d,\ outer} \approx R_{1contact}/N_{d,\ outer} + R_{d,\ outer,\ diffusion} + R_{d,\ outer,\ wire}$, $R_{d,\ inner} \approx R_{1contact}/N_{d,\ inner} + R_{d,\ inner,\ diffusion} + R_{d,\ inner,\ wire}$, where $R_{1contact}$ is the resistance of a single contact. Choose the layout that has the smallest difference.

Figure 5:
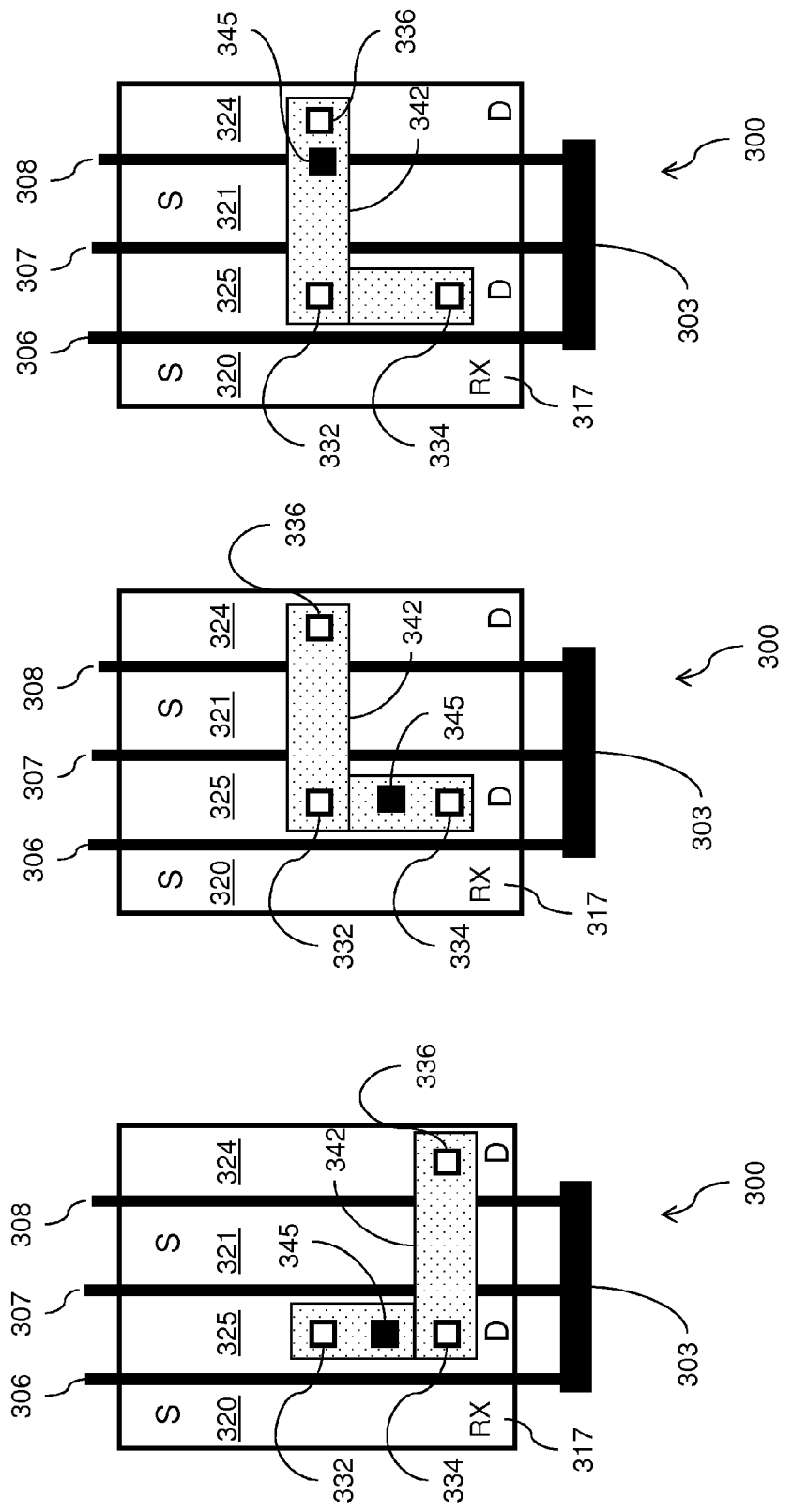
FIG. 5 is a schematic diagram of a semiconductor structure illustrating embodiments herein.

The illustrations in FIG. 5 continue to focus on the drain regions 324, 325. (In FIG. 5, the dummy fingers are not shown to improve clarity.) According to the illustrated embodiments, the locations of the electrical contacts 332, 334, 336 in the drain regions 324, 325 may be adjusted. Additionally, the location of via 345 (which represents a common connection point of all drain current) may be adjusted. First, as shown on the left, before adjusting the location of the electrical contacts 332, 334, 336 in the drain regions 324, 325, the resistance of the outer drain region 324 is greater than twice of the resistance of the inner drain region 325 ($R_{d,\ outer} > 2R_{d,\ inner}$) due to a larger diffusion (RX) resistance $R_{d,\ outer,\ diffusion}$ in the outer drain region 324. As shown in the middle illustration, after adjusting the location of the outer drain electrical contact point 336, the diffusion resistance $R_{d,\ outer,\ diffusion}$ of the outer drain region 324 is reduced; that is, the difference in $(R_{d,\ outer} - 2R_{d,\ inner})$ is reduced, leading to a smaller drain-node voltage spread between the inner drain region 325 and the outer drain region 324, $|V_{d,\ outer} - V_{d,\ inner}|$. If the resistance of the outer drain region 324 is still larger than twice of the resistance of the inner drain region 325 ($R_{d,\ outer} > 2R_{d,\ inner}$), then the diffusion resistance $|R_{d,\ outer} - 2R_{d,\ inner}|$ can be further reduced by moving the via 345 (again, it represents a common connection point of all drain current) towards the outer drain region 324, as shown on the right.

Figure 6:
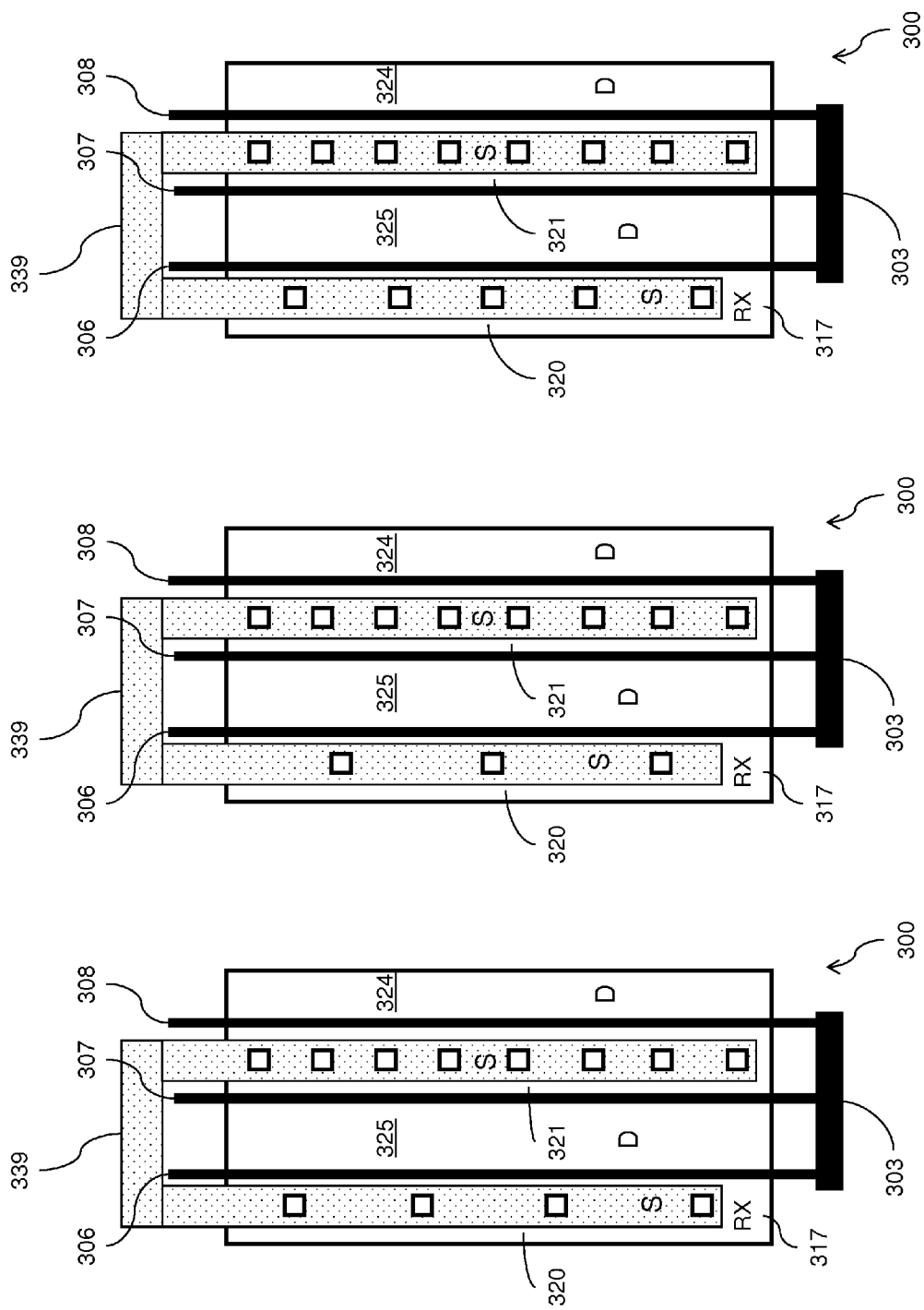
FIG. 6 is a schematic diagram of a semiconductor structure illustrating embodiments herein.

FIG. 6 shows the evolution of the FET 300 with focus on the inner and outer source regions 321, 320, respectively. (In FIG. 6, the dummy fingers are not shown to improve clarity.) Each of the three illustrations have the same number of electrical contacts in the inner source region 321, but different numbers of electrical contacts in the outer source region 320. As shown herein, calculate the difference between the resistance for the outer source region 320 and the inner source region 321 using an equation such as $|R_{s,\ outer} - 2R_{s,\ inner}|$ for each layout. Choose the layout that has the smallest difference.

Figure 7:
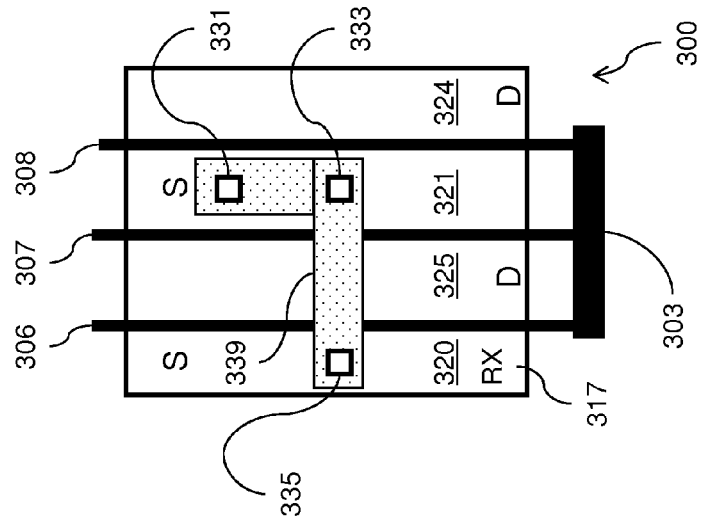
FIG. 7 is a schematic diagram of a semiconductor structure illustrating embodiments herein.
Figure 7:
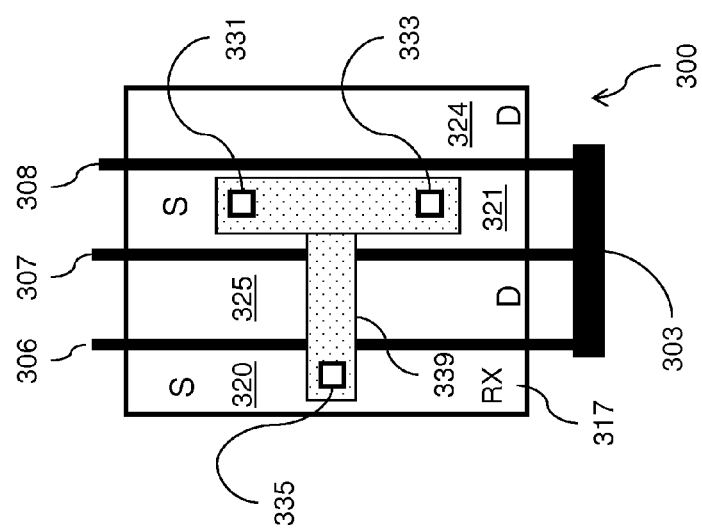

The illustrations in FIG. 7 continue to focus on the source regions 320, 321. (In FIG. 7, the dummy fingers are not shown to improve clarity.) According to the illustrated embodiments, the locations of the electrical contacts 331, 333, 335 in the source regions 320, 321 may be adjusted. As shown in FIG. 7, on the left, the diffusion resistance in the outer source region 320 is minimized, and so is the diffusion resistance of the inner source region 321. However, it is found that the resistance of the outer source region 320 is greater than twice of the resistance of the inner source region 321 ($R_{s,\ outer} > 2R_{s,\ inner}$). In this case, we can increase the diffusion resistance of the inner source region 321, as shown on the right, by moving the two electrical contacts 331, 333 in the inner source region 321 away from being symmetric and by moving one electric contact 333 away from the center of the lower half source region. Thus, the difference between the resistance of the outer source region 320 and twice the resistance of the inner source region 321 ($|R_{s,\ outer} - 2R_{s,\ inner}|$) is reduced, leading to a smaller source-node voltage spread between the inner source region 321 and the outer source region 320, $|V_{s,\ outer} - V_{s,\ inner}|$.

Figure 8:
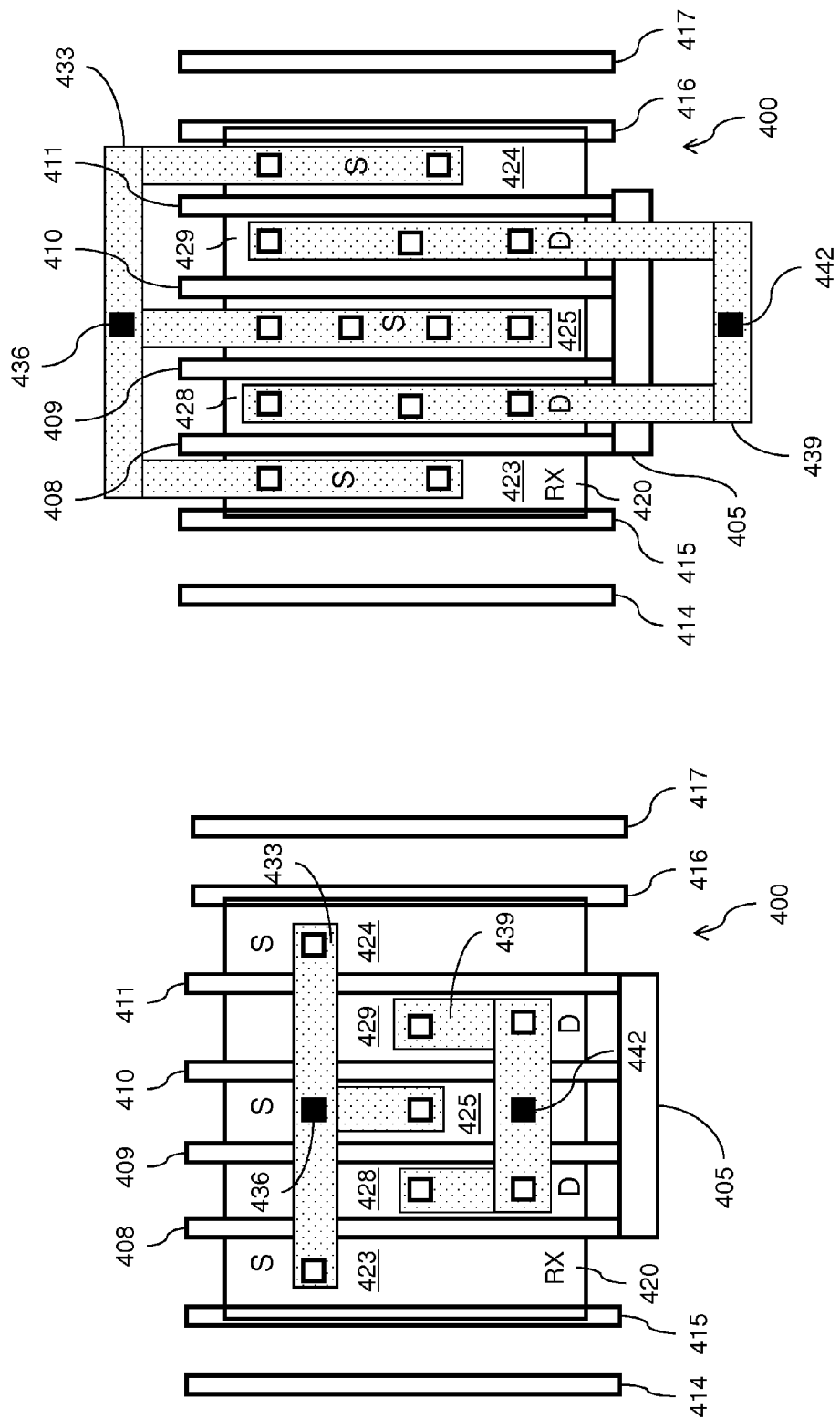
FIG. 8 is a schematic diagram of a semiconductor structure illustrating embodiments herein.

FIG. 8 shows a FET 400 having a four-finger gate 405 with multiple essentially parallel fingers 408-411, several dummy fingers 414-417, and a semiconductor body 420 that defines a diffusion shape, indicated as RX, which is divided into inner diffusion regions and outer diffusion regions. When the number of finger is an even number, commonly there are two outer source regions and no outer drain regions. In such a case, the number of drain regions is half the number of fingers. It is possible to have the opposite case of two outer drain regions and no outer source region, but that is less common. As shown in FIG. 8, the FET 400 includes two outer source regions 423, 424 and one inner source region 425. The FET 400 also includes two inner drain regions 428, 429.

According to embodiments herein, an equal number of electrical contacts are established in each outer source region 423, 424. The number of electrical contacts in each outer source region 423, 424 should be less than the number of electrical contacts in the inner source region 425. The number and locations of the electrical contacts in one inner drain region 428 should be identical to the number and locations of the electrical contacts in the other inner drain region 429.

As shown in FIG. 8, a first electrical connector 433, such as a first metal wire in the first metal layer M1, connects all the electrical contacts in the source regions 423-425. A first via 436 (which represents a common connection point on the source side for all drain currents) is located at approximately a middle point of the first electrical connector 433. A second electrical connector 439, such as a second metal wire in the first metal layer, connects all the drain regions 428, 429. A second via 442 (which is a common connection point of all drain current on the drain side) is located at approximately a middle point of the second electrical connector 439.

According to embodiments herein, the number of electrical contacts in the inner source region 425 and the locations of the electrical contacts in the inner source region 425, and the number of electrical contacts in both outer source regions 423, 424 and the locations of the electrical contacts in both outer source regions 423, 424 are adjusted so that the source-node voltage of the inner source region 425 is equal to the source-node voltages of the outer source regions 423, 424.

Figure 9:
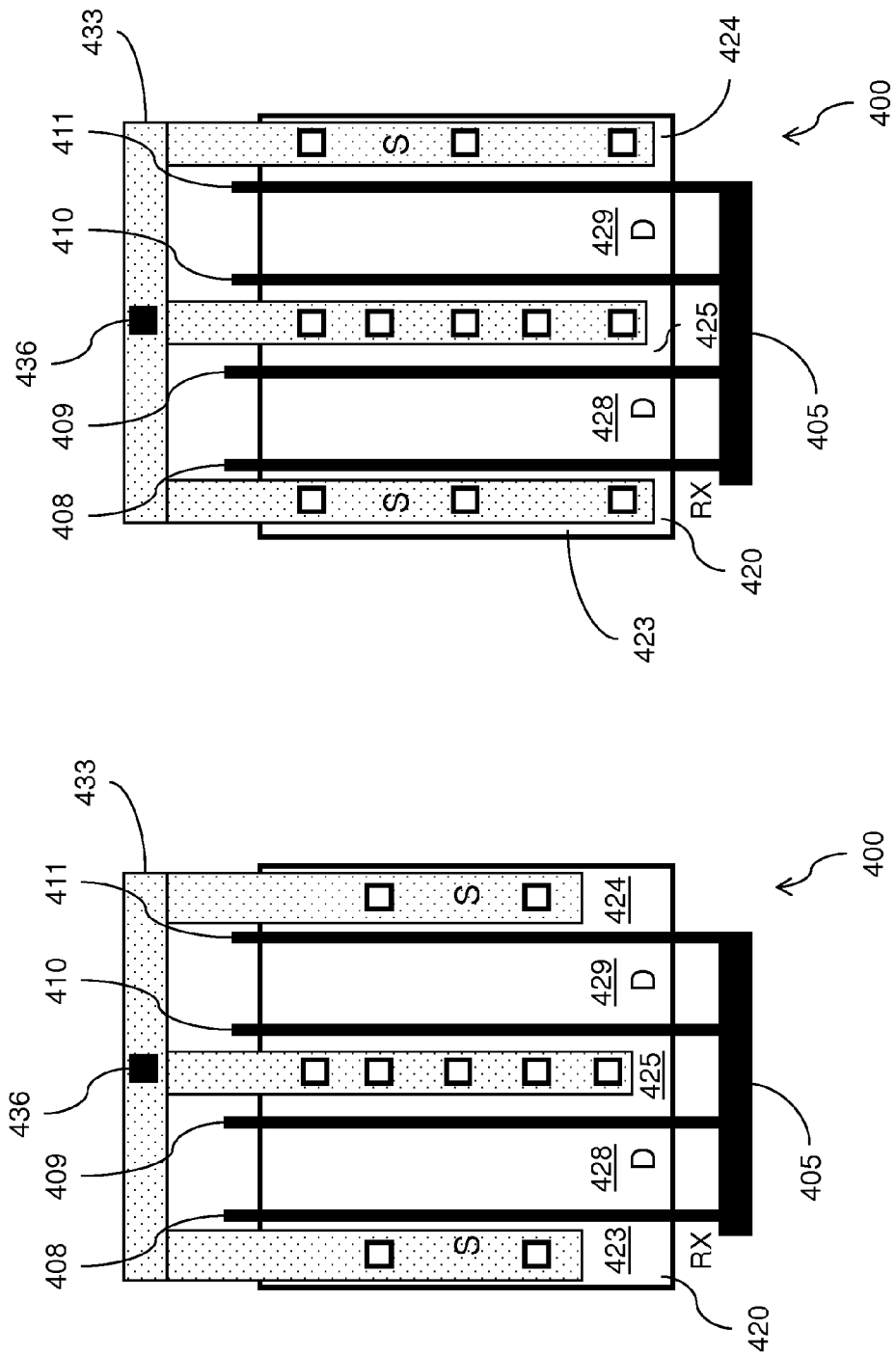
FIG. 9 is a schematic diagram of a semiconductor structure illustrating embodiments herein.

The illustrations in FIG. 9 focus on the inner and outer source regions 423-425 of the FET 400. (In FIG. 9, the dummy fingers are not shown to improve clarity.) On the left, there are five electrical contacts in the inner source region 425 and two electrical contacts for each of the two outer source regions 423, 424. On the right, there are five electrical contacts in the inner source region 425 and three electrical contacts for each of the two outer source regions 423, 424. According to embodiments herein, the number of contacts may be adjusted to reduce the spread in voltage (IR) drop between the outer source-node voltage and inner source-node voltage, taking into consideration that the drain current passing through the inner source region 425 is about twice of the drain current passing through the two outer source regions 423, 424. For each of the two layouts, determine the parasitic resistance ($R_{s,\ outer}$) of an outer source region 423, 424 and the parasitic resistance ($R_{s,\ inner}$) of an inner source region 425, and calculate the voltage (IR) drops $\Delta V_{s,\ outer}$ (=$I_{1finger} R_{s,\ outer}$) and $\Delta V_{s,\ inner}$ (=$2I_{1finger} R_{s,\ inner}$) as well as the difference between them $|\Delta V_{s,\ outer} - \Delta V_{s,\ inner}|$ (=$|I_1|R_{s,\ outer} - 2R_{s,\ inner}|$). Choose the layout that has a smaller difference.

Figure 10:
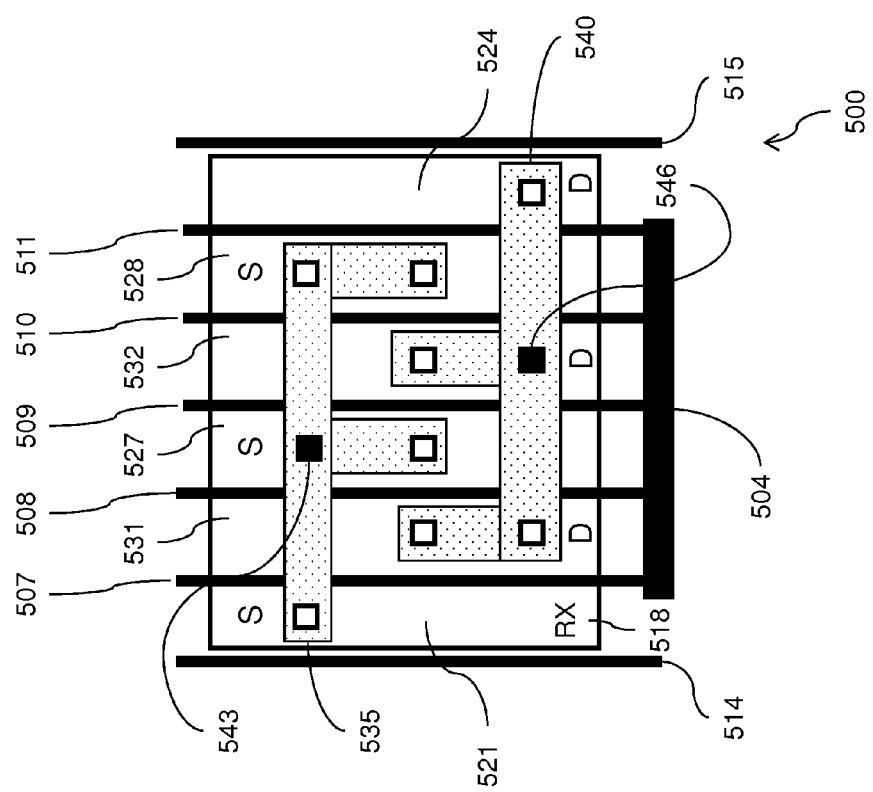
FIG. 10 is a schematic diagram of a semiconductor structure illustrating embodiments herein.

FIG. 10 shows a FET 500 having a five-finger gate 504 with multiple essentially parallel fingers 507-511, dummy fingers 514, 515, and a semiconductor body 518 that defines a diffusion shape, indicated as RX, which is divided into inner diffusion regions and outer diffusion regions. When the number of fingers is an odd number, there is one outer source region 521 and one outer drain region 524. When the number of fingers is at least five, there will be at least two inner drain regions and at least two inner source regions. As shown in FIG. 10, there are two inner source regions 527, 528 and two inner drain regions 531, 532.

According to embodiments herein, there are several electrical contacts located in the diffusion regions. As shown, there are more contacts in an inner source region than in an outer source region, and there are more contacts in an inner drain region than in an outer drain region. In some embodiments, the number of contacts in each inner source region is twice that in each outer source region and the number of contacts in each inner drain region is twice that in each outer drain region. As shown in FIG. 10, a first electrical connector 535, such as a first metal wire in the first metal layer (M1), connects the three source regions 521, 527, 528. A second electrical connector 540, such as a second metal wire in the first metal layer (M1), connects the three drain regions 524, 531, 532. A first via 543 (which is a common connection point of the drain current on the source side) is established in the first electrical connector 535, and a second via 546 (which is a common connection point of all drain currents on the drain side) is established in the second electrical connector 540.

According to embodiments herein, the number of electrical contacts in the three source regions 521, 527, 528, the locations of the electrical contacts in the three source regions 521, 527, 528, and the position of the first via 543 is adjusted to reduce the source-node voltage spread among the three source regions 521, 527, 528. Additionally, the number of electrical contacts in the three drain regions 524, 531, 532, the locations of the electrical contacts in the three drain regions 524, 531, 532, and the position of the second via 546 is adjusted to reduce the drain-node voltage spread among the three drain regions 524, 531, 532.

Figure 11:
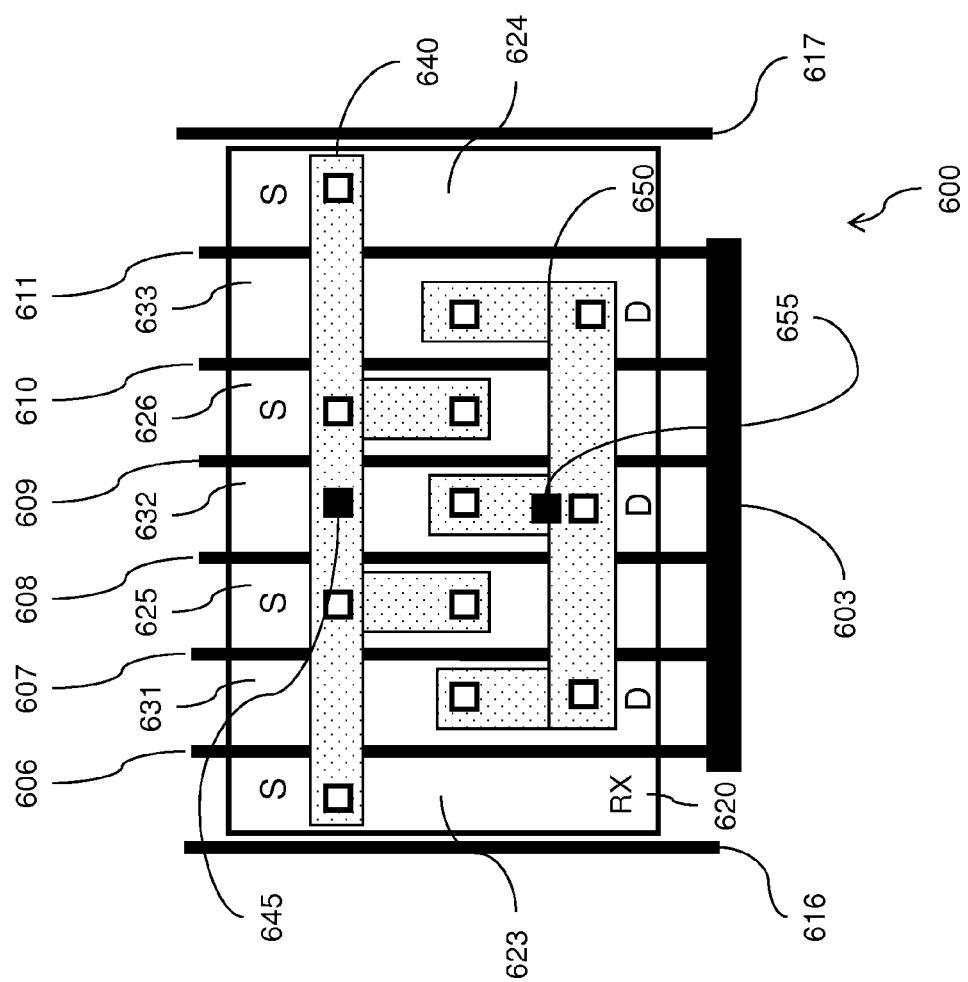
FIG. 11 is a schematic diagram of a semiconductor structure illustrating embodiments herein.

FIG. 11 shows a FET 600 having a six-finger gate 603 with multiple essentially parallel fingers 606-611, dummy fingers 616, 617, and a semiconductor body 620 that defines a diffusion shape, indicated as RX, which is divided into inner diffusion regions and outer diffusion regions. When the number of finger is an even number, commonly there are two outer source regions and no outer drain regions. In such a case, the number of drain regions is half the number of fingers. It is possible to have the opposite case of two outer drain regions and no outer source region, but that is less common. As shown in FIG. 11, the FET 600 includes two outer source regions 623, 624 and two inner source regions 625, 626. The FET 600 also includes three inner drain regions 631-633.

According to embodiments herein, an equal number of electrical contacts are established in each outer source region 623, 624. The number of electrical contacts in each outer source region 623, 624 should be less than the number of electrical contacts in the inner source regions 625, 626. When the number of fingers is at least six fingers, there will be at least three inner drain regions. In that case, the locations of the electrical contacts in all the inner drain regions 631-633 should be adjusted so that drain-side voltage drops for all the inner drain regions 631-633 are approximately equal. When the number of fingers is at least six fingers, the drain-side voltage (IR) drops for all drain regions may not be identical (counting IR drop on wires). The locations of the electrical contacts in all the inner drain regions 631-633 should be adjusted so that the drain-side voltage (IR) drops for all the inner drain regions are about the same.

As shown in FIG. 11, a first electrical connector 640, such as a first metal wire in the first metal layer M1, connects all the source regions 623-626. A first via 645 (which is a common connection point on the source side for all drain currents) is located at approximately a middle point of the first electrical connector 640. A second electrical connector 650, such as a second metal wire in the first metal layer M1, connects all the drain regions 631-633. A second via 655 (which is a common connection point of all drain currents point on the drain side) is located at approximately a middle point of the second electrical connector 650.

Figure 12:
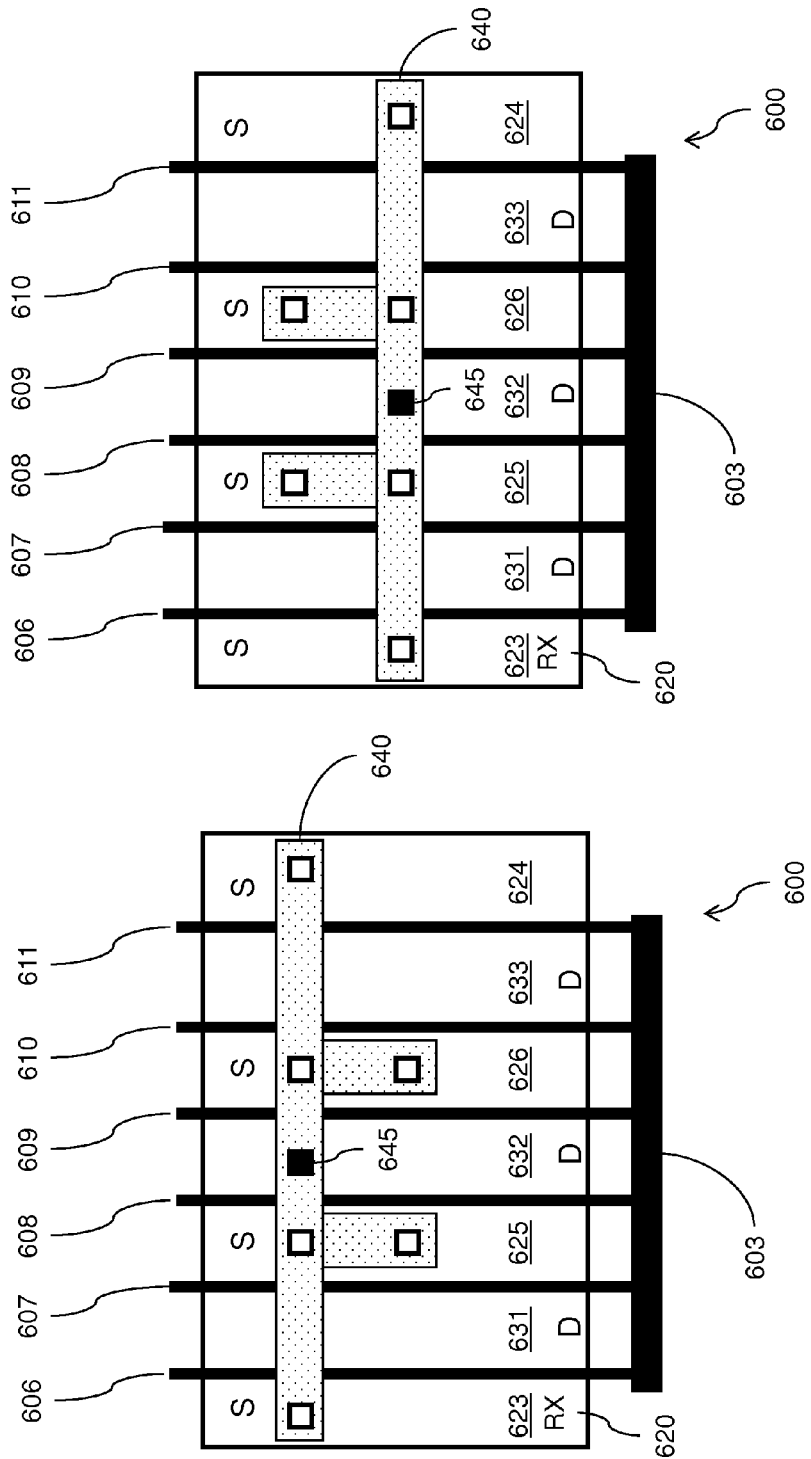
FIG. 12 is a schematic diagram of a semiconductor structure illustrating embodiments herein.

According to embodiments herein, the number of electrical contacts in the inner source regions 625, 626 and the locations of the electrical contacts in the inner source regions 625, 626, and the number of electrical contacts in both outer source regions 623, 624 and the locations of the electrical contacts in both outer source regions 623, 624 may be adjusted to reduce the difference between the source-node voltages of the outer source regions 623, 624 and the source-node voltages of the inner source regions 625, 626, such as shown in FIG. 12.

The illustrations in FIG. 12 focus on the source regions 623-626 of the FET 600. (In FIG. 12, the dummy fingers are not shown to improve clarity.) The locations of the electrical contacts are adjusted to reduce the difference between inner source-node voltage and outer source-node voltage. On the left, before adjusting locations of the source electrical contacts, $R_{s,\ outer} > 2R_{s,\ inner}$, due to a larger diffusion (RX) resistance in the outer source regions 623, 624. On the right, after adjusting the locations of the source electrical contacts, the diffusion resistance of the outer source regions 623, 624 is reduced; the difference in $|R_{s,\ outer} - 2R_{s,\ inner}|$ is further reduced, leading to a smaller source-node voltage spread, $|V_{s,\ outer} - V_{s,\ inner}|$.

Figure 13:
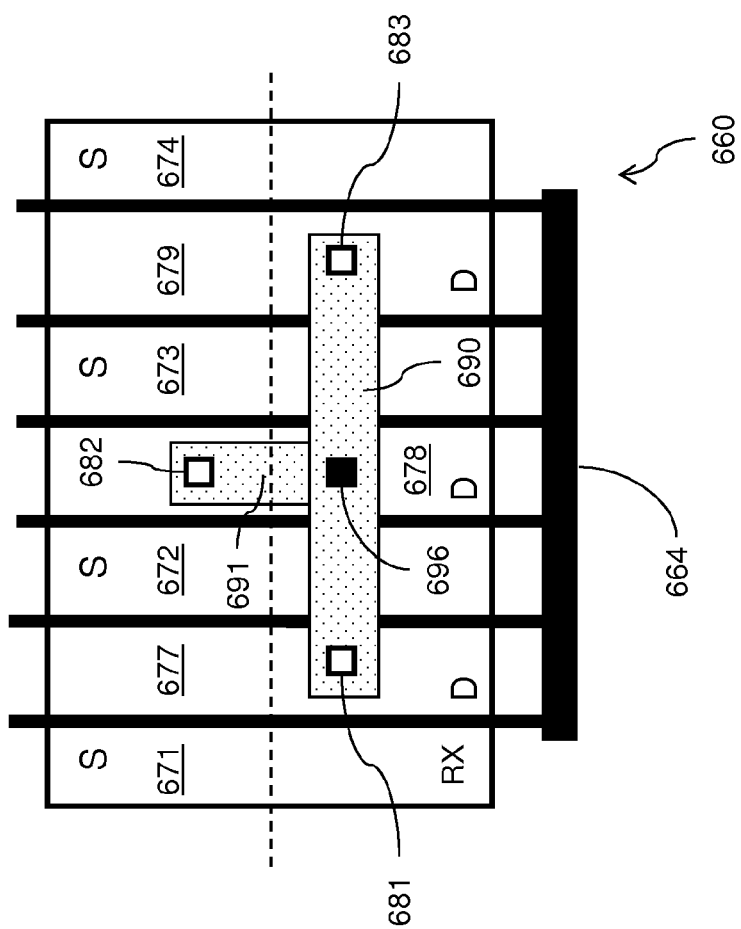
FIG. 13 is a schematic diagram of a semiconductor structure illustrating embodiments herein.

According to another embodiment herein, FIG. 13 shows an example of a FET 660 having a multi-finger gate 664. (In FIG. 13, the dummy fingers are not shown to improve clarity.) In the example of FIG. 13, FET 660 has four source regions 671-674 and three inner drain regions 677-679. This embodiment focuses on the inner drain regions 677-679 to adjust the locations of the electrical contacts 681-683. The location of contact 681 in drain region 677 is the same as the location of contact 683 in drain region 679, and is a mirror reflection of the location of contact 682 in drain section 678. According to this embodiment, the diffusion resistances in drain regions 677-679 are the same. Electrical connectors 690, 691, such as metal wires, connect all the drain regions 677-679. A via 696 (which is a common connection point on the drain side for all drain currents) is provided for the electrical connectors 690, 691 among the multiple contact levels. When the widths of the electrical connectors 690 and 691 are the same, the distance between contact 681 and the via 696, between contact 682 and the via 696, and between contact 683 and the via 696 should be the same. This should obtain the same drain-node voltage for drain regions 677-679.

The electrical conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, nickel, aluminum, or copper, or a metal silicide, any alloys of such metals, and may be deposited using physical vapor deposition, chemical vapor deposition, or any other technique known in the art.

For purposes herein, an "insulator" is a relative term that means a material or structure that allows substantially less electrical current to flow than does a "conductor." The dielectrics (insulators) mentioned herein can, for example, be formed by plasma deposition of SiO2 or SiO2 based materials by reacting either tetra-ethyl-ortho-silane (TEOS) or silane with O2 or activated O2, i.e. O3 or O—. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

Figure 14:
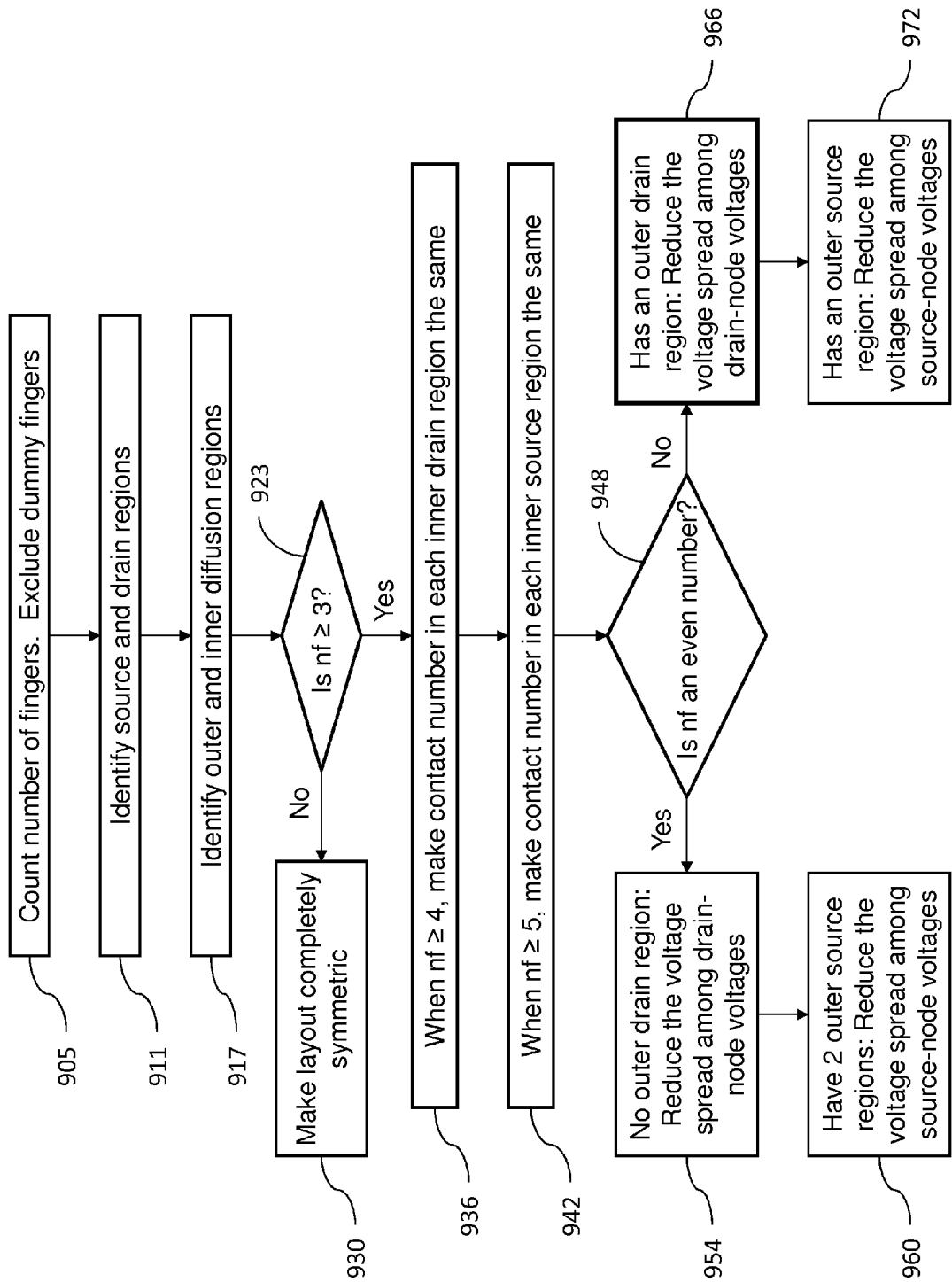
FIG. 14 is a flow diagram illustrating embodiments herein.

Referring to FIG. 14, a method of reducing the voltage spread among individual transistor fingers in a multi-finger transistor is shown. The first step, at 905, is to count the number of fingers ($n_f$) in a multi-finger transistor. Dummy fingers are excluded. A dummy finger is either a finger outside a diffusion (RX) shape or a finger whose width is not completely within a diffusion shape. At 911, each diffusion region in the multi-finger transistor is identified as either a source region or a drain region. At 917, each diffusion region is identified as either an outer diffusion region or an inner diffusion region. A diffusion region between two active fingers is an inner diffusion region. A diffusion region between an active finger and a diffusion edge is an outer diffusion region. A diffusion region between an active finger and a dummy finger is an outer diffusion region.

At 923, determine if the number of fingers is greater than or equal to three fingers. If the number of fingers is less than three, that means there are two fingers. In this case, make the transistor layout completely symmetric, as indicated at 930. In making the layout symmetric, include the same number of electric contacts for the two outer diffusion regions and make a via (which is a common connection point of all drain currents in the source side) in an electrical connector connecting both outer diffusion regions symmetric with respect to both the outer diffusion regions. A common connection point of the current drain is a point in the drain current path where the drain currents from all fingers first meet.

If, at 923 the number of fingers is greater than or equal to three, proceed to analyze the transistor structure. When, at 936, the number of fingers is greater than or equal to four, this means there are two or more inner drain regions; therefore, make the number of contacts in each of inner drain regions the same. When, at 942, the number of fingers is greater than or equal to five, this means there are two or more inner source regions; therefore, make the number of contacts in each of inner source regions the same.

At 948, determine if the number of fingers is an even number. If the number of fingers is an even number, that means either there are two outer source regions and no outer drain region, which is most common, or there are two outer drain regions and no outer source region. In either case, there are $n_f/2$ inner drain regions or inner source regions. In this case, make the number of contacts in each of outer source regions the same and make the number of contacts in an outer source region less than that in an inner source region. Create a common connection point on the drain side for all drain currents of the transistor in a first electrical connector connecting all the drain regions so that the common connection point on the drain side for all drain currents is located at the middle point of the electrical connector. Create a common connection point of the drain current on the source side of the transistor in another electrical connector connecting all the source regions so that the common connection point of the drain current on the source side is located at the middle point of this second electrical connector. When the number of fingers is an even number, reduce the voltage spread among drain-node voltages, as indicated at 954, and reduce the voltage spread among source-node voltages, as indicated at 960. The reduction of drain-node voltages and source-node voltages may be accomplished by varying the number of contacts, adjusting the locations of the contacts, the location of a common connection point of all drain current, and/or wire width. Alternatively, or in addition, the reduction of drain-node voltages and source-node voltages may be accomplished by making contact number in an outer source region less than that in an inner source region (when the two outer diffusion regions are source regions) or by making the number of contacts in an outer drain region less than that in an inner drain region (when the two outer diffusion regions are drain regions).

When the number of fingers is four, there are two inner drain regions, typically. Make the number of the electrical contacts in one inner drain region identical to that in the other drain region. Make the locations of the electrical contacts in one inner drain region identical to those in the other drain region. When the number of fingers is even and is greater than or equal to six, there are three or more inner drain regions and drain-side voltage (IR) drops for all $n_f/2$ drain regions are not identical usually (counting IR drop on wires). Adjust the locations of the electrical contacts in the inner drain regions so that the drain-side voltage (IR) drops for all inner drain regions are about the same, i.e., so that the difference among the drain-side voltage drops are reduced.

If, at 948 the number of fingers is an odd number, there is one outer source region and there is one outer drain region. In this case, make the number of contacts in the outer source region less than that in an inner source region and make the number of contacts in the outer drain region less than that in an inner drain region. Form a first electrical connector connecting all the source regions and another electrical connector connecting all the drain regions. When the number of fingers is an odd number, reduce the voltage spread among drain-node voltages, as indicated at 966 and reduce the voltage spread among source-node voltages, as indicated at 972. The reduction of drain-node voltage spread and source-node voltage spread may be accomplished by adjusting the number of contacts, the location of the contacts, the location of a common connection point of all drain current, and/or wire width. Alternatively, or in addition, the reduction of drain-node voltage spread and source-node voltage spread may be accomplished by making the number of contacts in an outer source region less than that in an inner source region and making the number of contacts in an outer drain region less than that in an inner drain region.

When the number of fingers is three, there is one inner drain region and one inner source region. Between the outer drain region and the inner drain region, adjust their contact numbers, contact locations, and/or the position of a common connection point on the drain side for all drain currents so that the difference in $|R_{d,\ outer} - 2R_{d,\ inner}|$ is reduced or is made to be zero. Between the outer source region and the inner source region, adjust their contact numbers, contact locations, and/or the position of a common connection point on the source side for all drain currents so that the difference in $|R_{s,\ outer} - 2R_{s,\ inner}|$ is reduced or is made to be zero. When the number of fingers is odd and is greater than or equal to five, there are two or more inner drain regions and two or more inner source regions. Among three or more drain regions, adjust their numbers of contacts, contact locations, and/or the position of a common connection point on the drain side for all drain currents to reduce the drain-node voltage spread among them. Among three or more source regions, adjust their numbers of contacts, contact locations, and/or the position of a common connection point on the source side for all drain currents to reduce the source-node voltage spread among them.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

According to a further embodiment herein, an article of manufacture is provided that includes a computer readable medium having computer readable instructions embodied therein for performing the steps of the computer implemented methods, including but not limited to the method illustrated in FIG. 14. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing.

Aspects of the present disclosure are described herein with reference to flowchart illustrations and/or block diagrams of methods, apparatus (systems) and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In case of implementing the embodiments herein by software and/or firmware, a program constituting the software may be installed into a computer with dedicated hardware, from a storage medium or a network, and the computer is capable of performing various functions if with various programs installed therein.

Figure 15:
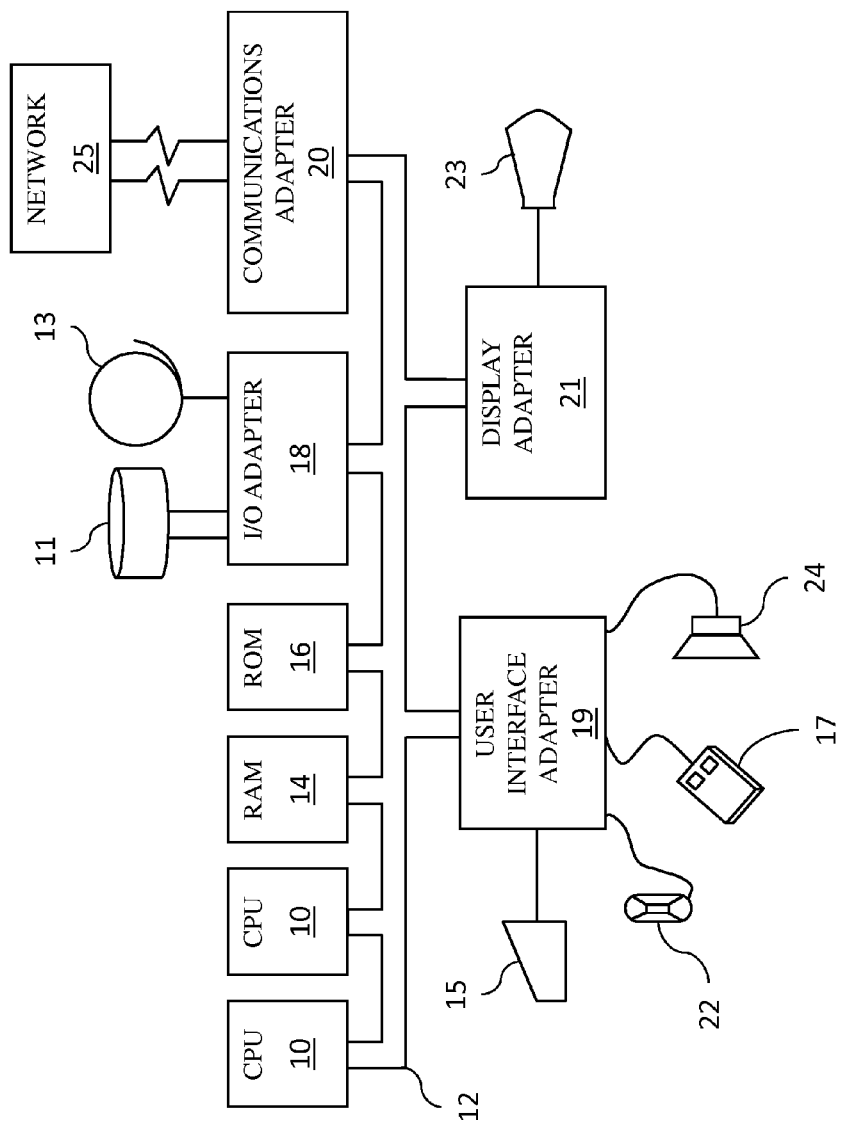
FIG. 15 is a schematic diagram of a hardware system according to embodiments herein.

A representative hardware environment for practicing the embodiments herein is depicted in FIG. 15. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein.

In FIG. 15, CPUs 10 perform various processing based on a program stored in a Read Only Memory (ROM) 16 or a program loaded from a peripheral device, such as disk units 11 and tape drives 13 to a Random Access Memory (RAM) 14. In the RAM 14, required data when the CPU 10 performs the various processing or the like is also stored as necessary. The CPU 10, the ROM 16, and the RAM 14 are connected to one another via a bus 12. An input/output adapter 18 is also connected to the bus 12 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 14, as necessary.

The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 including a network interface card such as a LAN card, a modem, or the like connects the bus 12 to a data processing network 25. The communication adapter 20 performs communication processing via a network such as the Internet. A display adapter 21 connects the bus 12 to a display device 23, which may be embodied as an output device such as a monitor (such as a Cathode Ray Tube (CRT), a Liquid Crystal Display (LCD), or the like), printer, or transmitter, for example.

In the case where the above-described series of processing is implemented with software, the program that constitutes the software may be installed from a network such as the Internet or a storage medium, such as the removable medium.

Those skilled in the art would appreciate that, the storage medium is not limited to the peripheral device having the program stored therein, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory, such as a "plug-and-play" memory device. Alternatively, the storage medium may be the ROM 16, a hard disk contained in the storage section 11, or the like, which has the program stored therein and is distributed to the user together with the device that contains them.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

As will be appreciated by one skilled in the art, aspects of the systems and methods herein may be embodied as a system, method, or computer program product. Accordingly, aspects of the present disclosure may take the form of an entirely hardware embodiment, an entirely software embodiment (including firmware, resident software, micro-code, etc.), or an embodiment combining software and hardware aspects, which may all generally be referred to herein as a "circuit," "module", or "system." Furthermore, aspects of the present disclosure may take the form of a computer program product embodied in one or more computer readable medium(s) having computer readable program code embodied thereon.

Computer program code for carrying out operations for aspects of the present disclosure may be written in any combination of one or more programming languages, including an object oriented programming language such as Java, Smalltalk, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment types include loading directly in the client, server, and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Alternatively, the process software is sent directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

While it is understood that the process software may be deployed by manually loading directly in the client, server, and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

Figure 16:
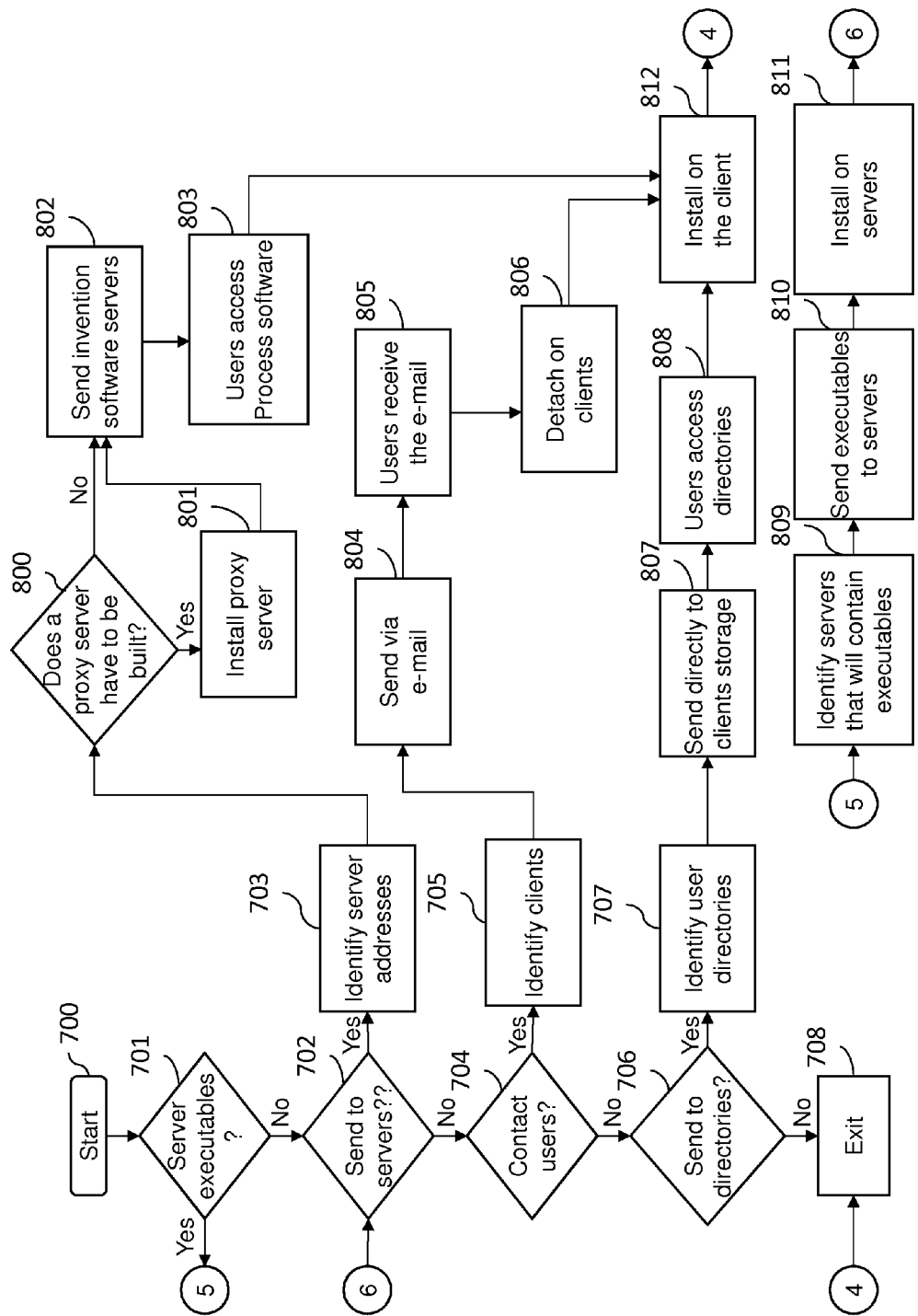
FIG. 16 is a schematic diagram of a deployment system according to embodiments herein.

In FIG. 16, step 700 begins the deployment of the process software. The first thing is to determine if there are any programs that will reside on a server or servers when the process software is executed 701. If this is the case, then the servers that will contain the executables are identified 809. The process software for the server or servers is transferred directly to the servers' storage via FTP or some other protocol, or by copying through the use of a shared file system 810. The process software is then installed on the servers 811.

Next, a determination is made on whether the process software is to be deployed by having users access the process software on a server or servers 702. If the users are to access the process software on servers, then the server addresses that will store the process software are identified 703.

A determination is made if a proxy server is to be built 800 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required, then the proxy server is installed 801. The process software is sent to the servers either via a protocol such as FTP or it is copied directly from the source files to the server files via file sharing 802. Another embodiment would be to send a transaction to the servers that contain the process software and have the server process the transaction, then receive and copy the process software to the server's file system. Once the process software is stored at the servers, the users, via their client computers, then access the process software on the servers and copy it to their client computers file systems 803. Another embodiment is to have the servers automatically copy the process software to each client and then run the installation program for the process software at each client computer. The users execute the program that installs the process software on their client computer 812, and then exit the process 708.

In step 704, a determination is made whether the process software is to be deployed by sending the process software to users via e-mail. The set of users where the process software will be deployed are identified together with the addresses of the user client computers 705. The process software is sent via e-mail 804 to each of the users' client computers. The users receive the e-mail 805 and then detach the process software from the e-mail to a directory on their client computers 806. The users execute the program that installs the process software on their client computer 812, and then exit the process 708.

Lastly, a determination is made on whether to the process software will be sent directly to user directories on their client computers 706. If so, the user directories are identified 707. The process software is transferred directly to the users' client computer directory 807. This can be done in several ways such as but not limited to sharing of the file system directories and then copying from the sender's file system to the recipient users' file system or alternatively using a transfer protocol such as File Transfer Protocol (FTP). The users access the directories on their client file systems in preparation for installing the process software 808. The users execute the program that installs the process software on their client computer 812, and then exit the process 708.

The process software is integrated into a client, server, and network environment by providing for the process software to coexist with applications, operating systems, and network operating systems software, and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists match the parameter lists required by the process software. Conversely, parameters passed by the software applications to the process software will be checked to ensure the parameters match the parameters required by the process software. The client and server operating systems including the network operating systems will be identified and compared to the list of operating systems, version numbers, and network software that have been tested to work with the process software. Those operating systems, version numbers, and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 17:
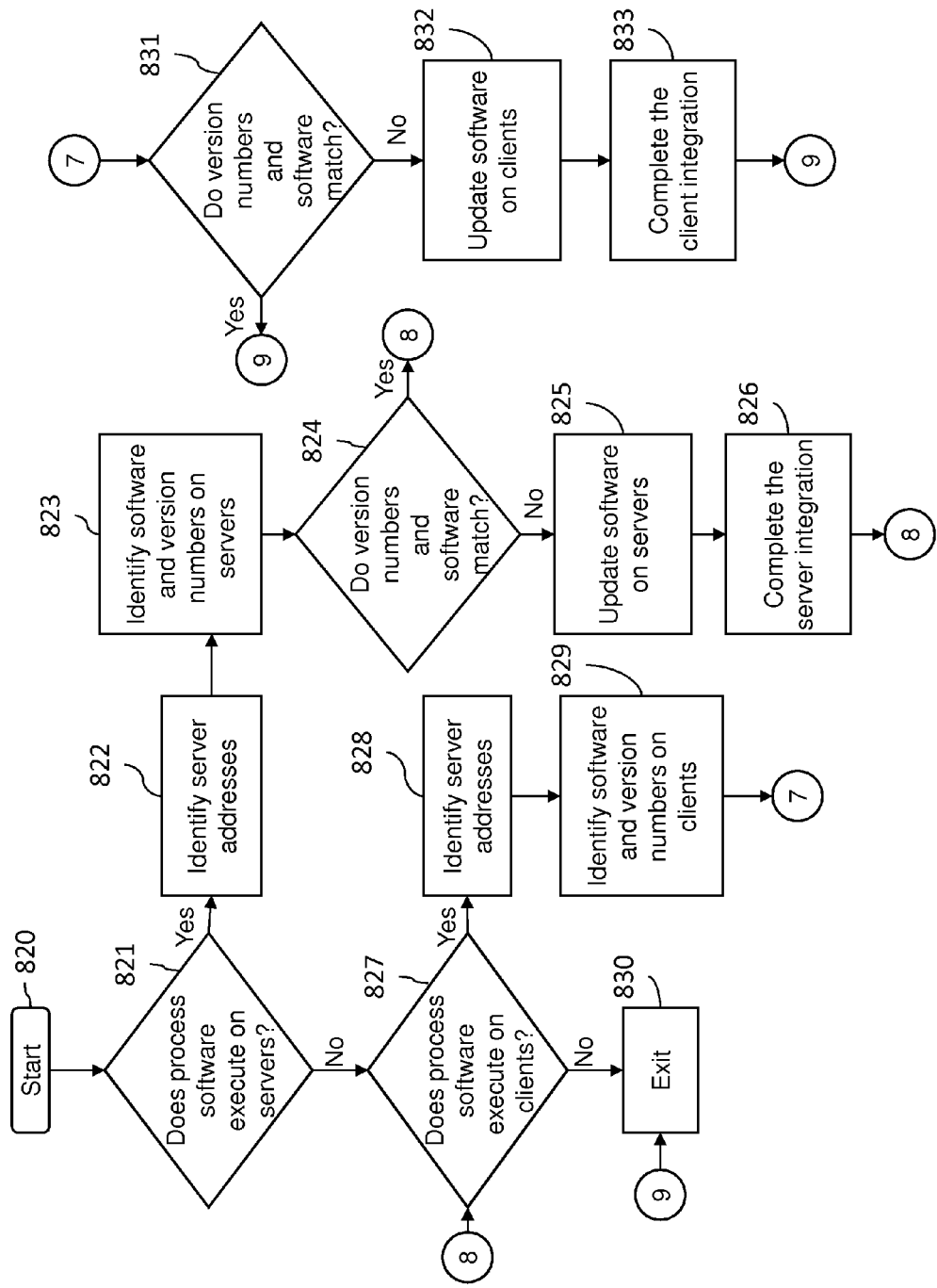
FIG. 17 is a schematic diagram of an integration system according to embodiments herein.

In FIG. 17, step 820 begins the integration of the process software. The first thing is to determine if there are any process software programs that will execute on a server or servers 821. If this is not the case, then integration proceeds to 827. If this is the case, then the server addresses are identified 822. The servers are checked to see if they contain software that includes the operating system (OS), applications, and network operating systems (NOS), together with their version numbers, that have been tested with the process software 823. The servers are also checked to determine if there is any missing software that is required by the process software 823.

A determination is made if the version numbers match the version numbers of OS, applications, and NOS that have been tested with the process software 824. If all of the versions match and there is no missing required software, the integration continues in 827.

If one or more of the version numbers do not match, then the unmatched versions are updated on the server or servers with the correct versions 825. Additionally, if there is missing required software, then it is updated on the server or servers 825. The server integration is completed by installing the process software 826.

Step 827, which follows either step 821, 824, or 826, determines if there are any programs of the process software that will execute on the clients. If no process software programs execute on the clients, the integration proceeds to 830 and exits. If this not the case, then the client addresses are identified 828.

The clients are checked to see if they contain software that includes the operating system (OS), applications, and network operating systems (NOS), together with their version numbers, that have been tested with the process software 829. The clients are also checked to determine if there is any missing software that is required by the process software 829.

A determination is made as to whether the version numbers match the version numbers of OS, applications, and NOS that have been tested with the process software 831. If all of the versions match and there is no missing required software, then the integration proceeds to 830 and exits.

If one or more of the version numbers do not match, then the unmatched versions are updated on the clients with the correct versions 832. In addition, if there is missing required software then it is updated on the clients 832. The client integration is completed by installing the process software on the clients 833. The integration proceeds to 830 and exits.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally, the assessed server may make requests of other servers that require CPU units. CPU units are an example that represents one measurement of use. Other measurements of use include but are not limited to network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise, when other measurements of use such as network bandwidth, memory usage, storage usage, etc. approach a capacity so as to affect performance, additional network bandwidth, memory usage, storage etc. are added to share the workload. The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and/or indicated on a web site accessed by the customer, which then remits payment to the service provider. In another embodiment, the service provider requests payment directly from a customer account at a banking or financial institution. In another embodiment, if the service provider is also a customer of the customer that uses the process software application, the payment owed to the service provider is reconciled to the payment owed by the service provider to minimize the transfer of payments.

The process software is shared, simultaneously serving multiple customers in a flexible, automated fashion. It is standardized, requiring little customization, and it is scalable, providing capacity on demand in a pay-as-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally, the assessed server may make requests of other servers that require CPU units. CPU units are an example that represents one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise, when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and/or indicated on a web site accessed by the customer, which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

Figure 18:
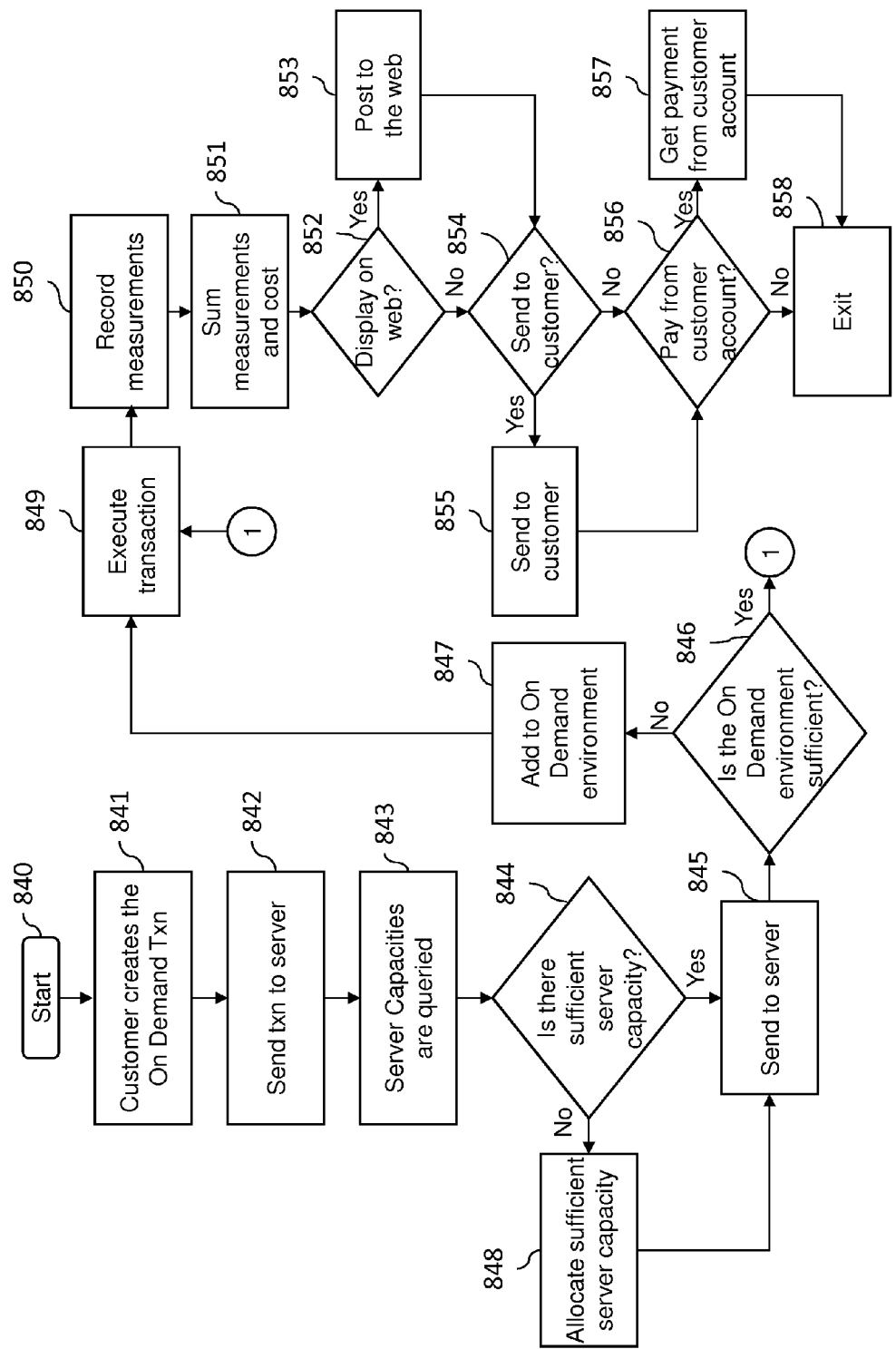
FIG. 18 is a schematic diagram of an on demand system according to embodiments herein.

In FIG. 18, step 840 begins the On Demand process. A transaction is created that contains the unique customer identification, the requested service type, and any service parameters that further specify the type of service 841. The transaction is then sent to the main server 842. In an On Demand environment, the main server can initially be the only server, then, as capacity is consumed, other servers are added to the On Demand environment.

The server central processing unit (CPU) capacities in the On Demand environment are queried 843. The CPU requirement of the transaction is estimated, then the servers' available CPU capacity in the On Demand environment are compared to the transaction CPU requirement to see if there is sufficient CPU capacity available in any server to process the transaction 844. If there is not sufficient server CPU capacity available, then additional server CPU capacity is allocated to process the transaction 848. If there was already sufficient CPU capacity available, then the transaction is sent to a selected server 845.

Before executing the transaction, a check is made of the remaining On Demand environment to determine if the environment has sufficient available capacity for processing the transaction. This environment capacity consists of such things as, but not limited to, network bandwidth, processor memory, storage etc. 846. If there is not sufficient available capacity, then capacity will be added to the On Demand environment 847. Next, the required software to process the transaction is accessed, loaded into memory, then the transaction is executed 849.

The usage measurements are recorded 850. The usage measurements consist of the portions of those functions in the On Demand environment that are used to process the transaction. The usage of such functions as, but not limited to, network bandwidth, processor memory, storage and CPU cycles are what is recorded. The usage measurements are summed, multiplied by unit costs, and then recorded as a charge to the requesting customer 851. If the customer has requested that the On Demand costs be posted to a web site 852, then they are posted 853.

If the customer has requested that the On Demand costs be sent via e-mail to a customer address 854, then they are sent 855. If the customer has requested that the On Demand costs be paid directly from a customer account 856, then payment is received directly from the customer account 857. The last step is to exit the On Demand process 858.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed, and executed through either a remote-access or a site-to-site VPN. When using the remote-access VPNs, the process software is deployed, accessed, and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download, and execute the process software.

When using the site-to-site VPN, the process software is deployed, accessed, and executed through the use of dedicated equipment and large-scale encryption, which are used to connect a company's multiple fixed sites over a public network, such as the Internet.

The process software is transported over the VPN via tunneling, which is the process of placing an entire packet within another packet and sending it over a network. The protocol of the outer packet is understood by the network and both points, called tunnel interfaces, where the packet enters and exits the network.

Figure 19:
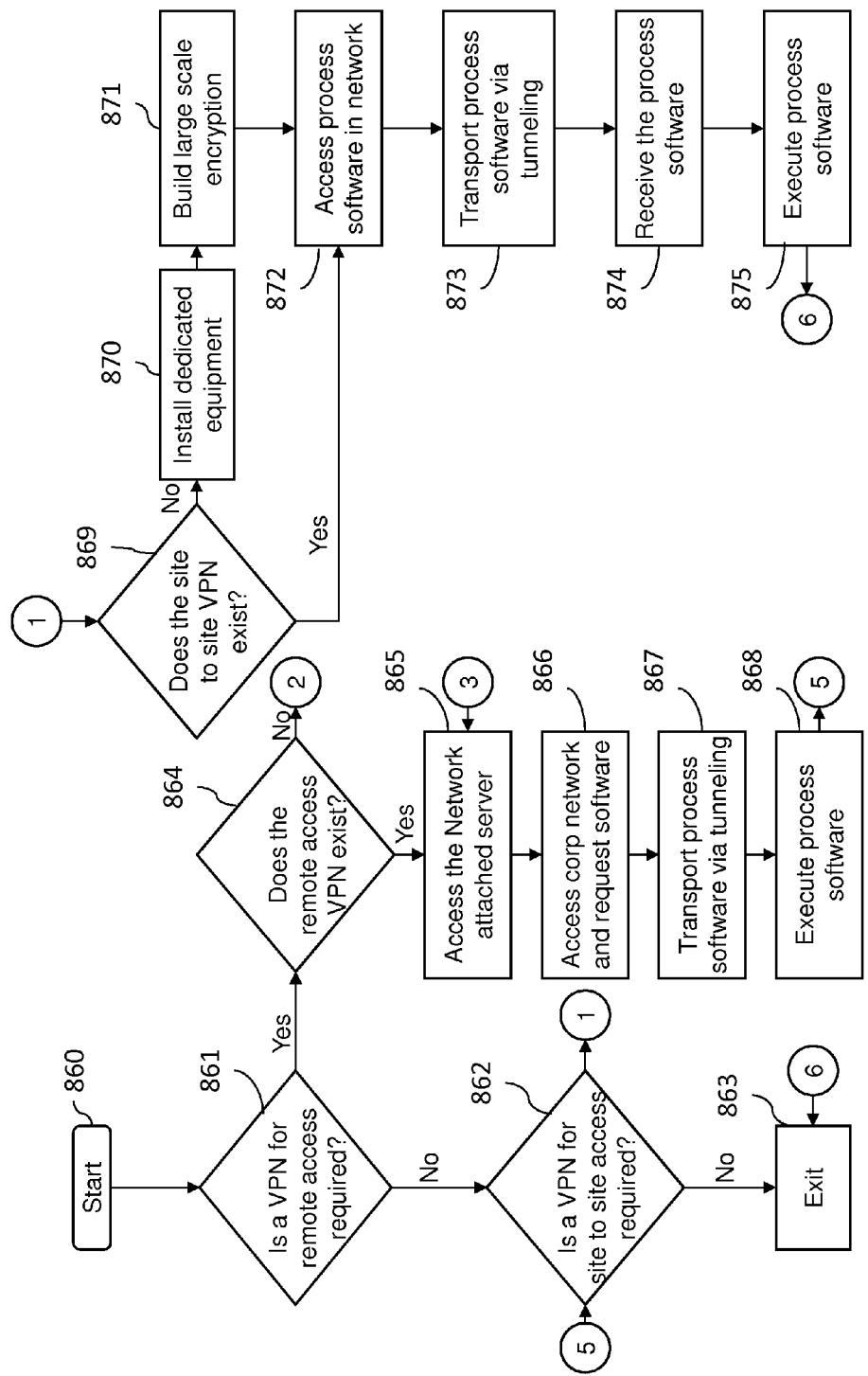
FIG. 19 is a schematic diagram of a virtual private network system according to embodiments herein.
Figure 20:
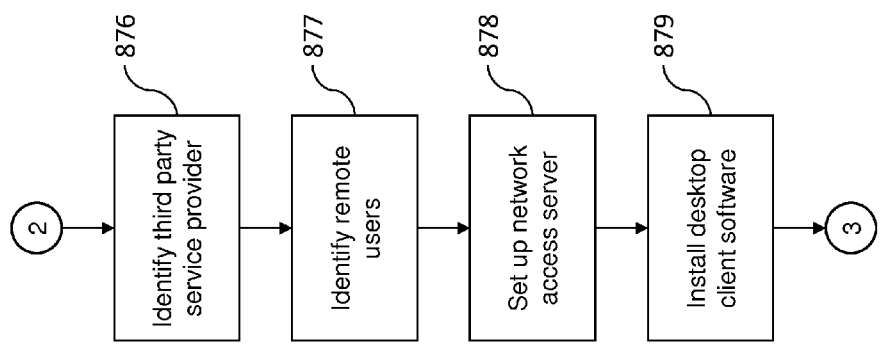
FIG. 20 is a schematic diagram of a virtual private network system according to embodiments herein.

In FIGS. 19 and 20, step 860 begins the Virtual Private Network (VPN) process. A determination is made to see if a VPN for remote access is required 861. If it is not required, then proceed to 862. If it is required, then determine if the remote access VPN exists 864.

If it does exist, then proceed to 865. Otherwise, identify the third party provider that will provide the secure, encrypted connections between the company's private network and the company's remote users 876. The company's remote users are identified 877. The third party provider then sets up a network access server (NAS) 878 that allows the remote users to dial a toll-free number or attach directly via a cable or DSL modem to access, download, and install the desktop client software for the remote-access VPN 879.

After the remote access VPN has been built, or if it been previously installed, the remote users can then access the process software by dialing into the NAS or attaching directly via a cable or DSL modem into the NAS 865. This allows entry into the corporate network where the process software is accessed 866. The process software is transported to the remote users' desktop over the network via tunneling. That is, the process software is divided into packets and each packet, including the data and protocol, is placed within another packet 867. When the process software arrives at the remote users' desktop, it is removed from the packets, reconstituted, and executed on the remote users' desktop 868.

A determination is made to see if a VPN for site-to-site access is required 862. If it is not required, then proceed to exit the process 863. Otherwise, determine if the site-to-site VPN exists 869. If it does exist, then proceed to 872. Otherwise, install the dedicated equipment required to establish a site-to-site VPN 870. Then build the large-scale encryption into the VPN 871.

After the site-to-site VPN has been built, or if it had been previously established, the users access the process software via the VPN 872. The process software is transported to the site users over the network via tunneling 873. That is, the process software is divided into packets and each packet, including the data and protocol, is placed within another packet 874. When the process software arrives at the remote users' desktop, it is removed from the packets, reconstituted, and executed on the site users' desktop 875. Proceed to exit the process 863.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for creating a semiconductor transistor design comprising a field effect transistor having a multi-finger gate structure on a diffusion shape, said multi-finger gate structure comprising gate fingers, and said diffusion shape comprising a diffusion edge positioned along a periphery of said diffusion shape, said method comprising:
    identifying, using a computerized device, inner diffusion regions of said multi-finger gate structure as being between said gate fingers;
    identifying, using said computerized device, outer diffusion regions of said multi-finger gate structure as being one of:
        between one of said gate fingers and said diffusion edge; and
        between one of said gate fingers and a dummy finger, said dummy finger being parallel to and electrically disconnected from said gate fingers;
    identifying, using said computerized device, each of said inner diffusion regions as being one of inner source regions and inner drain regions;
    identifying, using said computerized device, each of said outer diffusion regions as being one of outer source regions and outer drain regions;
    establishing electrical contacts in said inner diffusion regions and said outer diffusion regions, said establishing of said electrical contacts complying with a first ratio of there being approximately twice as many of said electrical contacts in said inner source regions as in said outer source regions, and said establishing of said electrical contacts complying with a second ratio of there being approximately twice as many of said electrical contacts in said inner drain regions as in said outer drain regions;
    tuning said first ratio to cause a voltage drop across said electrical contacts in said inner source regions and across said electrical contacts in said outer source regions to be approximately equal for all said gate fingers; and
    tuning said second ratio to cause a voltage drop across said electrical contacts in said inner drain regions and across said electrical contacts in said outer drain regions to be approximately equal for all said gate fingers.

2. The method of claim 1, further comprising tuning said first ratio and said second ratio such that all said gate fingers have at least one of: approximately equivalent drain current and approximately equivalent gate leakage.

3. The method of claim 1, said dummy finger comprising one of: a finger outside said diffusion shape and a finger whose width is not completely within said diffusion shape.

4. The method of claim 1, said field effect transistor comprising two of said gate fingers, said method further comprising:
    establishing an equal number of said electrical contacts in each of two of said outer diffusion regions; and
    creating a common connection point of all drain currents in an electrical connector connecting said two of said outer diffusion regions, said electrical connector being symmetric with respect to said two of said outer diffusion regions, and said common connection point being symmetric with respect to said electrical connector.

5. The method of claim 1, said field effect transistor comprising four or more of said gate fingers, and when a number of said inner drain regions is two or more, said method further comprising establishing an equal number of said electrical contacts in each of said inner drain regions.

6. The method of claim 1, said field effect transistor comprising four or more of said gate fingers, and when a number of said inner source regions is two or more, said method further comprising establishing an equal number of said electrical contacts in each of said inner source regions.

7. The method of claim 1, said field effect transistor comprising an even number of said gate fingers and a number of said gate fingers being four or more, and said field effect transistor further comprising two of said outer source regions and at least one of said inner drain regions, said method further comprising:
    establishing an equal number of said electrical contacts in each of said outer source regions, said number of said electrical contacts in each of said outer source regions being less than a number of said electrical contacts in said inner source regions;
    creating a first common connection point of drain current in a first electrical connector connecting all said inner drain regions and said outer drain regions, said first common connection point of drain current being located at approximately a middle point of said first electrical connector;
    creating a second common connection point of drain current in a second electrical connector connecting all said inner source regions and said outer source regions, said second common connection point of drain current being located at approximately a middle point of said second electrical connector;
    when said number of said gate fingers comprises four fingers, there being two of said inner drain regions, establishing locations of said electrical contacts in a first of said two of said inner drain regions to be identical to locations of said electrical contacts in a second of said two of said inner drain regions;
    when said number of said gate fingers comprises at least six fingers, there being at least three of said inner drain regions, establishing locations of said electrical contacts in said inner drain regions so that voltage drops for all said inner drain regions are approximately equal; and
    adjusting said number of said electrical contacts and said locations of said electrical contacts in said inner source regions and adjusting said number of said electrical contacts and said locations of said electrical contacts in said outer source regions so that a difference among voltages of said outer source regions and voltages of said inner source regions are approximately zero.

8. The method of claim 1, said field effect transistor comprising an odd number of said gate fingers and a number of said gate fingers being three or more, and said field effect transistor further comprising one of said outer source regions and one of said outer drain regions, said method further comprising:
   establishing a number of said electrical contacts in said one of said outer source regions to be less than a number of said electrical contacts in one of said inner source regions;
   establishing a number of said electrical contacts in said one of said outer drain regions to be less than a number of said electrical contacts in said one of said inner drain regions; and
   when said number of said gate fingers comprises three fingers, there being said one of said inner drain regions and said one of said inner source regions,
      establishing a first common connection point of drain current in a first electrical connector and adjusting at least one of: said number of said electrical contacts in said one of said outer drain regions and in said one of said inner drain regions, locations of said electrical contacts in said outer drain region and in said inner drain region, and a position of said first common connection point of drain current so that a difference in $|R_{d,\ outer} - 2R_{d,\ inner}|$ is approximately zero, where $R_{d,\ outer}$ comprises resistance of said one of said outer drain regions and where $R_{d,\ inner}$ comprises resistance of said one of said inner drain regions, and
      establishing a second common connection point of drain current in a second electrical connector and adjusting at least one of: said number of said electrical contacts in said one of said outer source regions and said one of said inner source regions, locations of said electrical contacts in said one of said outer source regions and said one of said inner source regions, and a position of said second common connection point of drain current so that a difference in $|R_{s,\ outer} - 2R_{s,\ inner}|$ is approximately zero, and
   when said number of said gate fingers comprises at least five fingers, there being at least two of said inner drain regions and at least two of said inner source regions,
      establishing said first common connection point of drain current in said first electrical connector connecting at least three of said inner drain regions and adjusting at least one of: said number of said electrical contacts in said at least three of said inner drain regions, said locations of said electrical contacts in said at least three of said inner drain regions, and a position of said first common connection point of drain current to reduce a voltage spread among said at least three of said inner drain regions, and
      establishing said second common connection point of drain current in said second electrical connector connecting at least three of said inner source regions and adjusting at least one of: said number of said electrical contacts in said at least three of said inner source regions, said locations of said electrical contacts in said at least three of said inner source regions, and a position of said second common connection point of drain current to reduce a voltage spread among said at least three of said inner source regions.

9. A semiconductor transistor structure, comprising:
   a field effect transistor comprising:
      a multi-finger gate structure comprising gate fingers, and
      a diffusion shape comprising a diffusion edge positioned along a periphery of said diffusion shape, said diffusion shape comprising:
         inner diffusion regions of said multi-finger gate structure, said inner diffusion regions being between said gate fingers, and said inner diffusion regions being one of inner source regions and inner drain regions, and
         outer diffusion regions of said multi-finger gate structure, said outer diffusion regions being one of: between one of said gate fingers and said diffusion edge and between one of said gate fingers and a dummy finger, said dummy finger being parallel to and electrically disconnected from said gate fingers, and said outer diffusion regions being one of outer source regions and outer drain regions; and
      a plurality of electrical contacts in said inner diffusion regions and said outer diffusion regions, there being a first ratio of approximately twice as many of said electrical contacts in said inner source regions as in said outer source regions, there being a second ratio of approximately twice as many of said electrical contacts in said inner drain regions as in said outer drain regions, said first ratio being tuned such that a voltage drop across said electrical contacts in said inner source regions and said electrical contacts in said outer source regions is approximately equal for all said gate fingers, and said second ratio being tuned such that a voltage drop across said electrical contacts in said inner drain regions and said electrical contacts in said outer drain regions is approximately equal for all said gate fingers.

10. The structure of claim 9, said first ratio and said second ratio being tuned such that all said gate fingers have at least one of: approximately equivalent drain current and approximately equivalent gate leakage.

11. The structure of claim 9, said dummy finger comprising one of: a finger outside said diffusion shape and a finger whose width is not completely within said diffusion shape.

12. The structure of claim 9, said field effect transistor comprising two of said gate fingers, said semiconductor structure further comprising:
   an electrical connector connecting said outer diffusion regions, said electrical connector comprising a common connection point of drain current, said electrical connector being symmetric with respect to said outer diffusion regions, and said common connection point being symmetric with respect to said electrical connector; and
   a number of said electrical contacts in each of two of said outer diffusion regions being equal.

13. The structure of claim 9, said field effect transistor comprising at least four of said gate fingers, said semiconductor further comprising:
   an equal number of said electrical contacts in each of said inner drain regions when a number of said inner drain regions is two or more.

14. The structure of claim 9, said field effect transistor comprising at least five of said gate fingers, said semiconductor further comprising:
   an equal number of said electrical contacts in each of said inner source regions when a number of said inner source regions is two or more.

15. The structure of claim 9, said field effect transistor comprising more than two of said gate fingers and a number of said gate fingers being an even number, said field effect transistor further comprising two of said outer source regions and at least one of said inner drain regions, said semiconductor further comprising:

an equal number of said electrical contacts in each of said two of said outer source regions, said number of said electrical contacts in each of said two of said outer source regions being less than a number of said electrical contacts in said at least one of said inner source regions;
a first electrical connector connecting all said inner drain regions and said outer drain regions, said first electrical connector comprising a first common connection point of drain current located at approximately a middle point of said first electrical connector;
a second electrical connector connecting all said inner source regions and said outer source regions, said second electrical connector comprising a second common connection point of drain current located at approximately a middle point of said second electrical connector;
when said number of said gate fingers comprises four fingers,
said field effect transistor comprising two of said inner drain regions, and said electrical contacts in a first of said two of said inner drain regions being located in positions identical to said electrical contacts in a second of said two of said inner drain regions;
when said number of said gate fingers comprises at least six fingers,
said field effect transistor comprising at least three of said inner drain regions, and said electrical contacts in said inner drain regions being located so that voltage drops for all said inner drain regions are approximately equal; and
said number of said electrical contacts and the locations of said electrical contacts in said inner source regions and said number of said electrical contacts and the locations of said electrical contacts in said outer source regions being selected so that a voltage of said outer source regions is at approximately a middle value of voltages of said inner source regions.

16. The structure of claim 9, said field effect transistor comprising more than two of said gate fingers and a number of fingers being an odd number, and said field effect transistor further comprising one of said outer source regions and one of said outer drain regions, said semiconductor further comprising:
a number of said electrical contacts in said one of said outer source regions being less than a number of said electrical contacts in said one of said inner source regions;
a number of said electrical contacts in said one of said outer drain regions being less than a number of said electrical contacts in said one of said inner drain regions; and
when said number of said gate fingers comprises three fingers, said field effect transistor comprising said one of said inner drain regions and said one of said inner source regions, said semiconductor further comprising:
a first electrical connector connecting said one of said outer drain regions and said one of said inner drain regions,
a first common connection point of drain current, and
at least one of: said number of said electrical contacts in said one of said outer drain regions and said one of said inner drain regions, the locations of said electrical contacts in said one of said outer drain regions and said one of said inner drain regions, and a position of said first common connection point of drain current being selected so that a difference in $|R_{d,\,outer} - 2R_{d,\,inner}|$ is approximately zero, where $R_{d,\,outer}$ comprises resistance of said one of said outer drain regions and where $R_{d,\,inner}$ comprises resistance of said one of said inner drain regions, and
a second electrical connector connecting said one of said outer source regions and said one of said inner source regions,
a second common connection point of drain current, and
at least one of: said number of said electrical contacts in said one of said outer source regions and in said one of said inner source regions, the locations of said electrical contacts in said one of said outer source regions and said one of said inner source regions, and a position of said second common connection point of drain current being selected so that a difference in $|R_{s,\,outer} - 2R_{s,\,inner}|$ is approximately zero, and
when said number of said gate fingers comprises at least five fingers, said field effect transistor comprising at least two of said inner drain regions and at least two of said inner source regions, said semiconductor further comprising:
a first electrical connector connecting at least three of said drain regions,
a first common connection point of drain current among said at least three of said drain regions, and
at least one of: said number of said electrical contacts in said at least three of said drain regions, the locations of said electrical contacts in said at least three of said drain regions, and a position of said first common connection point of drain current being selected to reduce a voltage spread among said at least three of said drain regions, and
a second electrical connector connecting at least three of said source regions,
a second common connection point of drain current among said at least three of said source regions, and
at least one of: said number of said electrical contacts in said at least three of said source regions, the locations of said electrical contacts in said at least three of said source regions, and a position of said second common connection point of drain current being selected to reduce a voltage spread among said at least three of said source regions.

17. A non-transitory computer readable storage medium readable by a computerized device, said non-transitory computer readable storage medium storing instructions executable by said computerized device to perform a method for creating a semiconductor transistor design comprising a field effect transistor having a multi-finger gate structure on a diffusion shape, said multi-finger gate structure comprising gate fingers, and said diffusion shape comprising a diffusion edge positioned along a periphery of said diffusion shape, said method comprising:
identifying inner diffusion regions of said multi-finger gate structure as being between said gate fingers;
identifying outer diffusion regions of said multi-finger gate structure as being one of:
between one of said gate fingers and said diffusion edge; and
between one of said gate fingers and a dummy finger, said dummy finger being parallel to and electrically disconnected from said gate fingers;
identifying each of said inner diffusion regions as being one of inner source regions and inner drain regions;
identifying each of said outer diffusion regions as being one of outer source regions and outer drain regions;
establishing electrical contacts in said inner diffusion regions and said outer diffusion regions, said establishing of said electrical contacts complying with a first ratio of there being approximately twice as many of said electrical contacts in said inner source regions as in said outer source regions, and said establishing of said electrical contacts complying with a second ratio of there being approximately twice as many of said electrical contacts in said inner drain regions as in said outer drain regions;

tuning said first ratio to cause a voltage drop across said electrical contacts in said inner source regions and across said electrical contacts in said outer source regions to be approximately equal for all said gate fingers; and tuning said second ratio to cause a voltage drop across said electrical contacts in said inner drain regions and across said electrical contacts in said outer drain regions to be approximately equal for all said gate fingers.

18. The non-transitory computer readable storage medium of claim 17, said field effect transistor comprising two of said gate fingers, said method further comprising:

establishing an equal number of said electrical contacts in each of two of said outer diffusion regions; and creating a common connection point of drain current in an electrical connector connecting said outer diffusion regions, said electrical connector being symmetric with respect to said outer diffusion regions, and said common connection point being symmetric with respect to said electrical connector.

19. The non-transitory computer readable storage medium of claim 17, said field effect transistor comprising more than two of said gate fingers, and when a number of said inner drain regions is two or more, a number of said gate fingers being at least four, said method further comprising:

establishing an equal number of said electrical contacts in each of said inner drain regions.

20. The non-transitory computer readable storage medium of claim 17, said field effect transistor comprising more than two of said gate fingers, and when a number of said inner source regions is two or more, a number of said gate fingers being at least five, said method further comprising:

establishing an equal number of said electrical contacts in each of said inner source regions.

* * * * *